United States Patent
Saito et al.

(10) Patent No.: US 11,430,498 B2
(45) Date of Patent: Aug. 30, 2022

(54) MAGNETORESISTANCE EFFECT ELEMENT, MAGNETIC MEMORY ARRAY, MAGNETIC MEMORY DEVICE, AND WRITE METHOD FOR MAGNETORESISTANCE EFFECT ELEMENT

(71) Applicant: TOHOKU UNIVERSITY, Miyagi (JP)

(72) Inventors: Yoshiaki Saito, Miyagi (JP); Shoji Ikeda, Miyagi (JP); Tetsuo Endoh, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 17/052,749

(22) PCT Filed: Apr. 10, 2019

(86) PCT No.: PCT/JP2019/015659
§ 371 (c)(1),
(2) Date: Nov. 3, 2020

(87) PCT Pub. No.: WO2019/216099
PCT Pub. Date: Nov. 14, 2019

(65) Prior Publication Data
US 2021/0233577 A1 Jul. 29, 2021

(30) Foreign Application Priority Data
May 9, 2018 (JP) .............................. JP2018-090997

(51) Int. Cl.
*G11C 11/00* (2006.01)
*G11C 11/16* (2006.01)
(Continued)

(52) U.S. Cl.
CPC ........ *G11C 11/161* (2013.01); *G11C 11/1675* (2013.01); *H01L 27/228* (2013.01); *H01L 43/02* (2013.01)

(58) Field of Classification Search
CPC ... G11C 11/161; G11C 11/1675; G11C 11/16; G11C 11/165; G11C 11/1659;
(Continued)

(56) References Cited

U.S. PATENT DOCUMENTS

| 9,218,864 B1 | 12/2015 | Yi et al. |
| 2015/0248939 A1* | 9/2015 | Nebashi .................. H01L 43/02 365/87 |

(Continued)

FOREIGN PATENT DOCUMENTS

| JP | 2009239135 A | 10/2009 |
| JP | 201445196 A | 3/2014 |

(Continued)

OTHER PUBLICATIONS

International Search Report Issued in PCT/JP2018/015659 dated Jul. 7, 2019.

*Primary Examiner* — Thong Q Le
(74) *Attorney, Agent, or Firm* — Fox Rothschild LLP; Robert J Sacco; Carol E. Thorstad-Forsyth

(57) ABSTRACT

The present invention provides a magnetoresistance effect element with a high read operation speed, a magnetic memory array, a magnetic memory device, and a write method for a magnetoresistance effect element. A magnetoresistance effect element includes: a heavy metal layer; a magnetic recording unit including a recording layer that includes a ferromagnetic layer that is magnetized in a vertical direction with respect to a film surface and is provided on a front surface of the heavy metal layer, a barrier layer that is provided on a surface of the recording layer which is opposite to the heavy metal layer and is formed from an insulator, and a reference layer which is provided on a surface of the barrier layer which is opposite to the recording layer, and a magnetization of the reference layer is fixed in the vertical direction with respect to a film (Continued)

surface; an insulating layer that is provided on a surface of the heavy metal layer which is opposite to the magnetic recording unit; a first terminal that is connected to the insulating layer at a position facing the recording layer with the heavy metal layer and the insulating layer interposed therebetween and applies a voltage to the heavy metal layer through the insulating layer; a second terminal that is connected to the reference layer; and a third terminal and a fourth terminal which are connected to the heavy metal layer, and cause a write current to flow to the heavy metal layer between the magnetic recording unit and the insulating layer.

15 Claims, 19 Drawing Sheets

(51) Int. Cl.
    *H01L 27/22*      (2006.01)
    *H01L 43/02*      (2006.01)

(58) Field of Classification Search
    CPC ............ G11C 11/1673; G11C 19/0841; G11C 11/1677; G11C 11/1697; G11C 11/18; G11C 19/0833; G11C 11/54; H01L 43/02; H01L 27/228; H01L 43/08; H01L 21/8239; H01L 27/105; H01L 29/82; H01L 27/222; H01L 27/224; H01L 43/12; H01L 43/10; H01L 43/06; H01L 27/226; H01L 27/22; H01L 45/04; H01F 10/3254; H01F 10/3286; H01F 41/302; H01F 10/329; H01F 41/18; H01F 1/047; H01F 10/12; H01F 10/32; H01F 10/3272
    USPC ........ 365/158, 148, 171, 189.05, 189.15, 87
See application file for complete search history.

(56) References Cited

U.S. PATENT DOCUMENTS

2018/0040811 A1    2/2018   Lee et al.
2018/0358542 A1   12/2018   Mihajlovic et al.

FOREIGN PATENT DOCUMENTS

JP      2017112351 A1    6/2017
JP      201822544 A      2/2018

\* cited by examiner

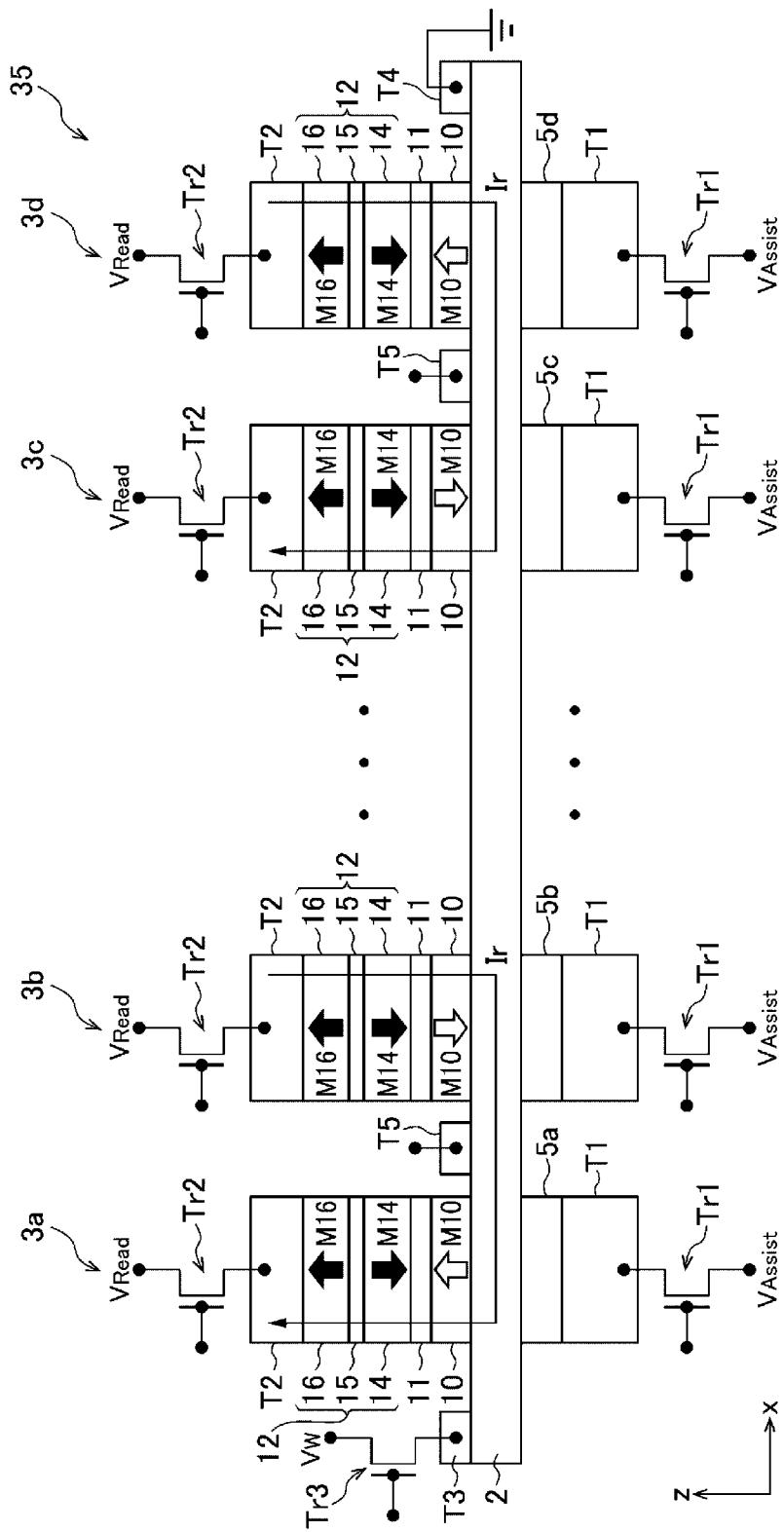

MAGNETORESISTANCE EFFECT ELEMENT, MAGNETIC MEMORY ARRAY, MAGNETIC MEMORY DEVICE, AND WRITE METHOD FOR MAGNETORESISTANCE EFFECT ELEMENT

CROSS REFERENCE TO RELATED APPLICATIONS

This application is a U.S. National Stage entry under 35 U.S.C. § 371 of International Application No. PCT/JP2019/015659, filed on Apr. 10, 2019, and which claims priority to Japanese Patent Application No. 2018-090997, filed on May 9, 2018, both of which are hereby incorporated herein by reference in their entireties.

TECHNICAL FIELD

The present invention relates to a magnetoresistance effect element, a magnetic memory array, a magnetic memory device, and a write method for a magnetoresistance effect element.

BACKGROUND ART

As a next-generation non-volatile memory that can obtain high speed and high rewrite resistance, a magnetic random access memory (MRAM) using a magnetoresistance effect element as a storage element is known. As a next-generation magnetoresistance effect element that is used for the MRAM, a spin-orbit torque magnetic random access memory (SOT-MRAM) element that reverses a magnetization of a magnetic tunnel junction (MTJ) by using spin-orbit torque has attracting attention.

The SOT-MRAM element has a configuration in which the MTJ including a three-layer structure of a ferromagnetic layer (also referred to as a recording layer)/an insulating layer (also referred to as a barrier layer)/a ferromagnetic layer (also referred to as a reference layer) is provided on a heavy metal layer. In the case of a Co—Fe-type magnetic material that is currently used, the SOT-MRAM element has properties in which resistance of an element is higher in an anti-parallel state in which magnetization directions of the recording layer and the reference layer are anti-parallel in comparison to a parallel state in which the magnetization directions of the recording layer and the reference layer are parallel to each other, and data is recorded by associating the parallel state and the anti-parallel state with 0 and 1. In the SOT-MRAM element, the magnetization direction of the reference layer is fixed, and magnetization reversal of the recording layer is possible, and thus the parallel state and the anti-parallel state can be switched through magnetization reversal of the recording layer. In the SOT-MRAM element, a current is caused to flow to the heavy metal layer to induce a spin current by a spin-orbit interaction, and spins polarized by the spin current flow into the recording layer. According to this, a magnetization of the recording layer is reversed, and data is written. In addition, since the recording layer is magnetized in a direction of easy axis of magnetization, even when inflow of the spins disappears, a magnetized state is maintained, and thus the SOT-MRAM element stores data.

In order to highly integrate the SOT-MRAM element, there is suggested an architecture in which a plurality of MTJs are arranged on the heavy metal layer (refer to Patent Literature 1). In the architecture disclosed in Patent Literature 1, data is written to the MTJ by using a mechanism in which magnetic anisotropy of the MTJ can be controlled by applying a voltage to the MTJ. First, a voltage is applied to the MTJ to which data is to be written to lower the magnetic anisotropy of the recording layer so as to cause the recording layer to enter a state (also referred to as a semi-selection state) in which magnetization reversal is easy. Then, a write current is caused to flow to the heavy metal layer to reverse a magnetization of the recording layer, and then data is written. In this manner, in a magnetic memory device of Patent Literature 1, an MTJ to be written can be selected by applying a voltage to the MTJ.

CITATION LIST

Patent Literature

Patent Literature 1: JP-A-2017-112351

SUMMARY OF INVENTION

Technical Problem

However, in the architecture disclosed in Patent Literature 1, so as to cause the MTJ to enter the semi-section state, a voltage is also applied to the MTJ even in writing. Therefore, a current also flows to the MTJ even in writing, and thus it is necessary to raise a withstand voltage of the MTJ by thickening the insulating layer so that the insulating layer constituting the barrier layer of the MTJ does not undergo insulation breakdown even when applying a voltage to the MTJ for causing the recording layer to enter the semi-selection state. However, when the insulation layer is made thick, a resistance value of the MTJ becomes high, and read time delay occurs. As described above, in the SOT-MRAM element of the related art, there is a problem that a write operation is fast but a read operation becomes slow when trying to integrate the element.

Here, the invention has been made in consideration of the above-described problem, and an object thereof is to provide a magnetoresistance effect element with a high read operation speed, a magnetic memory array, a magnetic memory device, and a write method for a magnetoresistance effect element.

Solution to Problem

According to an aspect of the invention, there is provided a magnetoresistance effect element including: a heavy metal layer; a magnetic recording unit including a recording layer that includes a ferromagnetic layer that is magnetized in a vertical direction with respect to a film surface and is provided on a front surface of the heavy metal layer, a barrier layer that is provided on a surface of the recording layer which is opposite to the heavy metal layer and is formed from an insulator, and a reference layer which is provided on a surface of the barrier layer which is opposite to the recording layer, and a magnetization of the reference layer is fixed in the vertical direction with respect to a film surface; an insulating layer that is provided on a surface of the heavy metal layer which is opposite to the magnetic recording unit; a first terminal that is connected to the insulating layer at a position facing the recording layer with the heavy metal layer and the insulating layer interposed therebetween and applies a voltage to the heavy metal layer through the insulating layer; a second terminal that is connected to the reference layer; and a third terminal and a fourth terminal which are connected to the heavy metal layer, and cause a write current to flow to the heavy metal layer between the magnetic recording unit and the insulating layer.

According to another aspect of the invention, there is provided a magnetic memory array including a plurality of the magnetoresistance effect elements according to any one of claims 1 to 8. The heavy metal layer of one of the magnetoresistance effect elements extends in a first direction, the extended heavy metal layer is shared by the other plurality of magnetoresistance effect elements, and the magnetic recording units are arranged in the first direction on the front surface of the heavy metal layer.

According to still another aspect of the invention, there is provided a magnetic memory device including a plurality of the magnetic memory arrays according to claim 9 or 10 which are arranged in a direction orthogonal to the first direction.

According to still another aspect of the invention, there is provided a magnetic memory device including: a magnetic memory array including a plurality of the magnetoresistance effect elements according to claim 7 or 8, the heavy metal layer of one of the magnetoresistance effect elements extending in a first direction, the extended heavy metal layer being shared by the other plurality of magnetoresistance effect elements, the magnetic recording units being arranged in the first direction on the front surface of the heavy metal layer; a plurality of first elongated terminals extending in a direction orthogonal to the first direction; and a plurality of second elongated terminals extending in a direction orthogonal to the first direction. A plurality of the magnetic memory arrays are arranged in a direction orthogonal to the first direction, a plurality of the magnetic recording units are arranged in a direction orthogonal to the first direction, the first elongated terminals are provided at positions facing the plurality of arranged magnetic recording units with the heavy metal layer and the insulating layer interposed therebetween, and the second elongated terminals are provided at positions facing the plurality of arranged magnetic recording units, and are in contact with the diode.

According to still another aspect of the invention, there is provided a write method for a magnetoresistance effect element including a heavy metal layer, a magnetic recording unit including a recording layer that includes a ferromagnetic layer that is magnetized in a vertical direction with respect to a film surface and is provided on a front surface of the heavy metal layer, a barrier layer that is provided on a surface of the recording layer which is opposite to the heavy metal layer and is formed from an insulator, and a reference layer which is provided on a surface of the barrier layer which is opposite to the recording layer, and a magnetization of the reference layer is fixed in the vertical direction with respect to a film surface, and an insulating layer that is provided on a surface of the heavy metal layer which is opposite to the magnetic recording unit. The method includes a magnetization reversal process of applying a voltage to the heavy metal layer through the insulating layer, and causing a write current to flow between one end and the other end of the heavy metal layer to reverse a magnetization direction of the recording layer.

Advantageous Effects of Invention

According to the invention, since the insulating layer is provided on the rear surface of the heavy metal layer, and the first terminal is connected to the heavy metal layer at a position facing the recording layer with the heavy metal layer and the insulating layer interposed therebetween, the magnetization of the recording layer can be reversed by applying a voltage to the heavy metal layer through the insulating layer, and causing a write current to flow to the heavy metal layer, and a current does not flow to the magnetic recording unit in writing. According to this, in the magnetoresistance effect element, it is possible to reduce the resistance of the MTJ by reducing the thickness of the barrier layer, and it is possible to speed up a read operation.

BRIEF DESCRIPTION OF DRAWINGS

FIG. 10C is a schematic cross-sectional view illustrating a magnetic memory array of still another modification example of the invention.

DESCRIPTION OF EMBODIMENTS

(1) Magnetoresistance Effect Element of Embodiment of Invention

(1-1) Overall Configuration of Magnetoresistance Effect Element

Figure 1A:
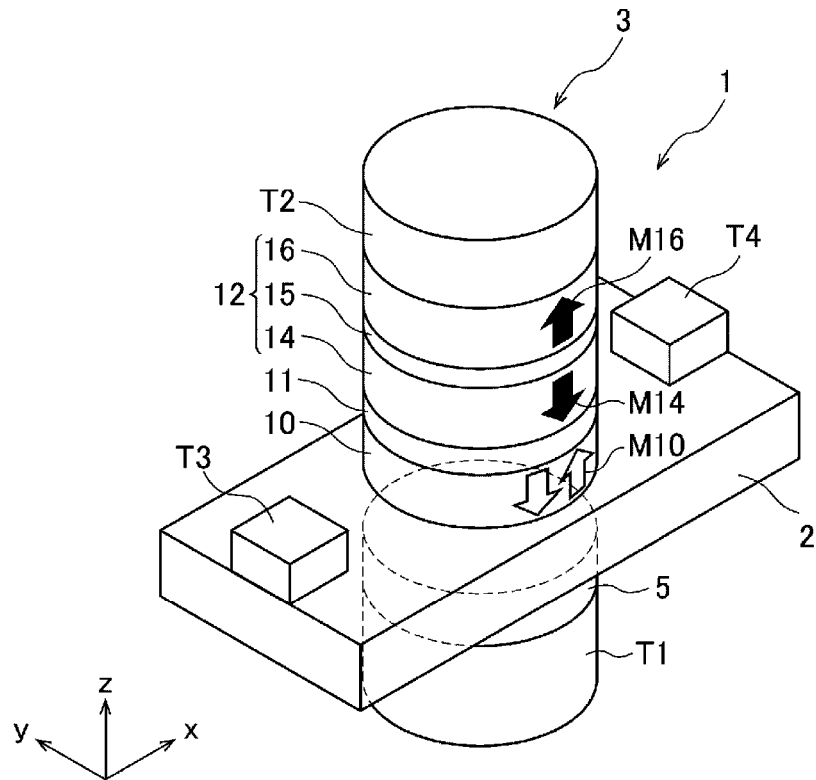
FIG. 1A is a perspective view illustrating a magnetoresistance effect element of an embodiment of the invention.
Figure 1B:
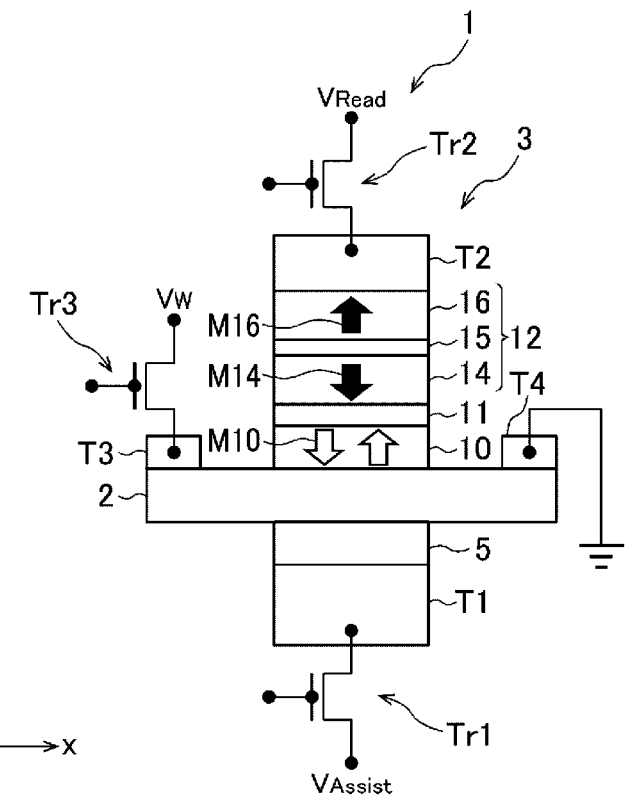
FIG. 1B is a cross-sectional view obtained by cutting the magnetoresistance effect element in FIG. 1A in an x-direction.

Hereinafter, a magnetoresistance effect element 1 of an embodiment of the invention will be described with reference to FIG. 1A and FIG. 1B. FIG. 1A is a perspective view illustrating the magnetoresistance effect element 1. In this specification, as illustrated in FIG. 1A, a longitudinal direction of a heavy metal layer 2 is set as an x-direction (an upper-right of a paper surface is +x-direction), a lateral direction is set as a y-direction (an upper-left direction of the paper surface in the perspective is +y-direction), and a direction orthogonal to a front surface of the heavy metal layer 2 is set as a z-direction (an upper side of the paper surface is a +z-direction). In addition, FIG. 1B is a schematic view illustrating a cross-section of the magnetoresistance effect element 1 in the y-direction. In this specification, it is assumed that the +z-direction is referred to, for example, as an upper side, an upper portion, or the like, and the −z-direction is referred to, for example, as a lower side, a lower portion, or the like.

As illustrated in FIG. 1A, the magnetoresistance effect element 1 includes the heavy metal layer 2, a magnetic recording unit 3 including a magnetic tunnel junction (hereinafter, referred to as "MTJ") including a recording layer 10, a barrier layer 11, and a reference layer 12, and an insulating layer 5. In this embodiment, the heavy metal layer 2 has a rectangular parallelepiped shape extending in a first direction (x-direction), and has a rectangular shape when viewed from an upper surface. The heavy metal layer 2 has a rectangular parallelepiped shape having a length (length in the x-direction) of approximately to 260 nm, a width (length in the y-direction) of approximately 10 to 150 nm, and a thickness (length in the z-direction) of approximately 0.5 to 20 nm. In the heavy metal layer 2, the width of the heavy metal layer 2 in the y-direction is set to be greater than a width of the magnetic recording unit 3.

The length of the heavy metal layer 2 is preferably as short as possible as long as a current can pass therethrough, and in this case, a high density of a magnetic memory device including the magnetoresistance effect element 1 can be realized. It is preferable that the width of the heavy metal layer 2 is set to be the same length as the width of the magnetic recording unit 3, and in this case, the magnetoresistance effect element 1 has the highest write efficiency. It is preferable that the thickness of the heavy metal layer 2 is set to approximately 1 to 10 nm. Note that, the length of the heavy metal layer 2 is a preferred length when the heavy metal layer 2 includes one piece of the magnetic recording unit 3, and in a case where one piece of the heavy metal layer 2 includes a plurality of the magnetic recording units 3 and the magnetic recording units 3 are arranged in the first direction, there is no limitation to the above-described length. The shape of the heavy metal layer 2 is preferably set as described above, but there is no particular limitation.

As the heavy metal layer 2, a heavy metal in which a spin orbit interaction is large, for example, Hf, Ta, W, Re, Os, Ir, Pt, Au, Pb, Pd, Rh, or an alloy that contains at least one or more among these elements is preferable. As the alloy, for example, W—Hf, W—Ta, Pt—Au, Pt—Ir, Pd—Rh, and the like are particularly preferable. The heavy metal layer 2 has conductivity. Note that, when the heavy metal layer 2 is formed from Ir, Pt, Au, or an alloy mainly containing at least one or more among these metals, a sign of a spin hall angle of the heavy metal layer 2 becomes positive, and when the heavy metal layer 2 is formed from Hf, Ta, W, Re, or an alloy mainly containing at least one or more among these metals, the sign of the spin hall angle of the heavy metal layer 2 becomes negative.

In this embodiment, the heavy metal layer 2 is formed from Pt—Au in which the sign of the spin hall angle is positive, and is formed in a thickness of 7 nm. The heavy metal layer 2 is formed by forming a heavy metal film, for example, by a typical film formation method such as physical vapor deposition (PVD) after forming a first terminal T1 to be described later and the insulating layer 5 on a base layer (for example, an SiO$_2$ substrate or the like) or a circuit substrate (a substrate in which an FET-type transistor, a metal wiring, or the like is formed). The heavy metal layer 2 may be an amorphous layer or an epitaxial layer formed by epitaxial growth. The epitaxial layer represents a thin film formed by epitaxial growth, and examples thereof include a single crystal layer, a layer that is generally a single crystal but partially a polycrystal or the like, a layer that can be actually regarded as a single crystal, and the like.

The magnetic recording unit 3 includes the recording layer 10 provided on the heavy metal layer 2, the barrier layer 11 provided on the recording layer 10 (a surface of the recording layer 10 which is opposite to the heavy metal layer 2), and the reference layer 12 provided on the barrier layer 11 (a surface of the barrier layer 11 which is opposite to the recording layer 10), and is provided on a surface of the heavy metal layer 2. The magnetic recording unit 3 is formed on the heavy metal layer 2 in a circular column shape, and has a circular shape when viewed form an upper surface. Accordingly, an aspect ratio of the magnetic recording unit 3 is approximately 1. Here, the aspect ratio of the magnetic recording unit 3 stated in this specification represents an aspect ratio of a shape of the magnetic recording unit 3 when viewed from the upper surface. In a case where the magnetic recording unit 3 has a shape (or a cross-section in a width direction) such as a square shape and a circular shape in which the major axis and the minor axis are not distinguished when viewed from the upper surface, the aspect ratio is 1. The aspect ratio is a ratio between a length of a long side and a length of a short side in the case of a quadrilateral shape, and is a ratio between a length of the major axis and a length of the minor axis in the case of an elliptical shape. The aspect ratio is preferably approximately 1 to 1.5, and more preferably approximately 1 to 1.3. In this case, it is possible to manufacture a magnetic memory device in which magnetoresistance effect elements are arranged at a higher density in comparison to the related art. Note that, it is preferable that the aspect ratio of the magnetic recording unit 3 is set to approximately 1 to 1.5, and more preferably approximately 1 to 1.3, but the aspect ratio or the shape of the magnetic recording unit 3 is not particularly limited, and a cubic body, a rectangular parallelepiped body, an elliptical column, or the like is also possible. For example, the magnetic recording unit 3 can have a quadrangular column shape with round corners.

In the magnetic recording unit 3, it is preferable that the length of the short side or the length of the minor axis (a length of one side or a diameter in a case where the aspect ratio is 1) is set to 10 to 100 nm, and larger capacity can be realized as the length is as small as possible in this range. In addition, in the case of this embodiment, the magnetic recording unit 3 is shaped to a circular column shape by using a photolithography technology after stacking respective layers of the magnetic recording unit 3 on the heavy metal layer 2 by the same method as in the heavy metal layer 2.

The recording layer 10 of the magnetic recording unit is a ferromagnetic film formed from a ferromagnetic material. In this embodiment, the recording layer 10 is directly formed on the heavy metal layer 2, and is in contact with the heavy metal layer 2. A material and the thickness of the recording layer 10 and the barrier layer 11 to be described later are selected so that interface magnetic anisotropy occurs in an interface between the recording layer 10 and the barrier layer 11. Accordingly, the recording layer 10 is magnetized in a vertical direction with respect to a film surface (hereinafter, simply referred to as "vertical direction") due to the interface magnetic anisotropy occurred in the interface between the recording layer 10 and the barrier layer 11. In FIG. 1A and FIG. 1B, a magnetization M10 of the recording layer 10 is indicated by a white blank arrow, and a direction of the arrow indicates a magnetization direction. A situation in which two arrows of an upward arrow and a downward arrow are drawn in the recording layer 10 represents that a magnetization of the recording layer 10 can be reversed. Note that, actually, a component that does not face the magnetization direction (arrow direction) is also included. Hereinafter, this is also true of a case where a magnetization is indicated by an arrow in the drawings of this specification.

As described above, in order to occur the interface magnetic anisotropy in the recording layer 10, the recording layer 10 has a configuration in which a CoFeB layer or an FeB layer is disposed at an interface with the barrier layer 11 of MgO or the like, and a multi-layer film such as a Co/Pt multi-layer film, a Co/Pd multi-layer film, and a Co/Ni multi-layer film which include a Co layer, a regular alloy such as Mn—Ga, Mn—Ge, and Fe—Pt, an alloy such as Co—Pt, Co—Pd, Co—Cr—Pt, and Co—Cr—Ta—Pt which contain Co, or the like is inserted between the heavy metal layer 2 and the CoFeB layer or the FeB layer. The number of stacks, a film thickness, and the like of the multi-layer films and the alloys are appropriately adjusted in correspondence with a size of the MTJ. The barrier layer 11 is preferably formed from an insulator such as MgO, Al$_2$O$_3$, AlN, and MgAlO. In addition, the thickness of the recording layer 10 is 0.8 to 5.0 nm and preferably 1.0 to 3.0 nm, and the thickness of the barrier layer 11 is 0.1 to 2.5 nm and preferably 0.5 to 1.5 nm.

In this embodiment, the recording layer 10 is set to a five-layer film of amorphous CoFeB (1.5 nm)/Ta (0.4 nm)/Co (0.4 nm)/Pt (0.4 nm)/Co (0.4 nm) from the barrier layer 11 side, and the barrier layer 11 is set to MgO (100) (1.0 nm). In the case of using MgO in the barrier layer 11, when forming the recording layer 10 and the barrier layer 11 in this manner, it is advantageous from the viewpoint that an MR variation rate of the magnetic recording unit 3 can be raised. Note that, the recording layer 10 is preferably an amorphous layer. The reason for this is as follows. When MgO is stacked on an amorphous metal layer, an MgO layer in which a single crystal oriented in a (100) direction is dominant is formed and thus it is easy to form MgO (100) on the recording layer 10 due to the characteristic. In addition, an ultrathin film that cuts crystal growth is inserted so as to form an amorphous layer on a polycrystal or single crystal thin film. In this embodiment, Ta (0.4 nm) as the ultrathin film that cuts crystal growth is inserted between CoFeB (1.5 nm) and Co (0.4 nm). The Ta ultrathin film can be changed to an ultrathin film of W, Mo, or the like. Here, the layer in which a single crystal is dominant represents a crystalline layer having the same degree of crystallinity as the epitaxial layer formed by epitaxial growth. Note that, the configuration of the recording layer 10 can be appropriately changed in correspondence with the material of the heavy metal layer 2. For example, in a case where the heavy metal layer 2 is formed from a W—Ta alloy, the recording layer 10 can be set as one layer of CoFeB (1.5 nm).

The recording layer 10 is magnetized in the vertical direction due to the interface magnetic anisotropy. However, an easy axis of magnetization may be caused to occur in the vertical direction to magnetize the recording layer 10 in the vertical direction by magnetic crystalline anisotropy or shape magnetic anisotropy. In this case, as the recording layer 10, for example, an alloy containing at least one or more of Co, Fe, Ni, and Mn is preferable. Specifically, as an alloy containing Co, alloys such as Co—Pt, Co—Pd, Co—Cr—Pt, and Co—Cr—Ta—Pt is preferable, and particularly, it is preferable that the alloys are so-called Co-rich alloys containing Co in a larger amount in comparison to other elements. As an alloy containing Fe, alloys such as Fe—Pt and Fe—Pd are preferable, and particularly, it is preferable that the alloys are so-called Fe-rich alloys containing Fe in a larger amount in comparison to other elements. As an alloy containing Co and Fe, alloys such as Co—Fe, Co—Fe—Pt, and Co—Fe—Pd are preferable. The alloy containing Co and Fe may be Co-rich or Fe-rich. As an alloy containing Mn, alloys such as Mn—Ga and Mn—Ge are preferable. In addition, the alloy containing at least one or more kinds of Co, Fe, Ni, and Mn may contain some elements such as B, C, N, O, P, Al, and Si.

Note that, the recording layer 10 may be a stacked film of a ferromagnetic layer formed from the above-described material, and a non-magnetic layer formed from a non-magnetic material such as Ta, W, Mo, Pt, Pd, Ru, Rh, Ir, Cr, Au, Cu, Os, and Re. In a case where the recording layer 10 is set as the stacked film, a layer that is in contact with the heavy metal layer 2 and a layer that is in contact with the barrier layer 11 are set as a ferromagnetic layer. The recording layer 10 may be a stacked film in which a ferromagnetic layer and a non-magnetic layer are alternately stacked, and a layer on the most heavy metal layer 2 side and a layer on the most barrier layer 11 side are ferromagnetic layers as in a three-layer stacked film in which a first ferromagnetic layer, a first non-magnetic layer, and a second ferromagnetic layer are stacked in this order on the heavy metal layer 2, a five-layer stacked film in which a first ferromagnetic layer, a first non-magnetic layer, a second ferromagnetic layer, a second non-magnetic layer, and a third ferromagnetic layer are stacked in this order on the heavy metal layer 2. Magnetizations of the ferromagnetic layers facing each other with the non-magnetic layer interposed therebetween may be antiferromagnetically coupled or may be ferromagnetically coupled by an interlayer interaction.

The non-magnetic layers (the first non-magnetic layer and the second non-magnetic layer) are formed from a non-magnetic metal such as Ir, Rh, Ru, Os, Re, or alloys of these elements, and are formed in a range of 0.5 to 1.0 nm or 1.8 to 2.3 nm in the case of Ru, in a range of 0.5 to 0.8 nm in the case of Ir, 0.7 to 1.0 nm in the case of Rh, 0.75 to 1.2 nm in the case of Os, and in a range of 0.5 to 0.95 nm in the case of Re. When the ferromagnetic layers (the first ferromagnetic layer and the second ferromagnetic layer, or the second ferromagnetic layer and the third ferromagnetic layer) are stacked through each of the non-magnetic layers having the thickness, magnetizations of the ferromagnetic layers facing each other with the non-magnetic layer interposed therebetween can be antiferromagnetically coupled due to the interlayer interaction. A structure in which the ferromagnetic layers and the non-magnetic layers are alternately stacked, and the ferromagnetic layers facing each other with the non-magnetic layer interposed therebetween are antiferromagnetically coupled due to the interlayer interaction and the magnetization directions are anti-parallel is referred to as a stacked ferri structure in this specification.

The interlayer interaction varies in correspondence with the thickness of the non-magnetic layer between the ferromagnetic layers, and can also ferromagnetically couple the two ferromagnetic layers. In this case, when the thickness of the non-magnetic layer is made to be smaller or larger in comparison to a case where the magnetizations of the ferromagnetic layers are antiferromagnetically coupled, the magnetizations of the ferromagnetic layers facing each other with the non-magnetic layer interposed therebetween can be ferromagnetically coupled due to the interlayer interaction.

In a case where the recording layer 10 is an epitaxial layer or a polycrystal ferromagnetic layer, it is preferable that the recording layer 10 is provided with a non-magnetic layer that is formed from Ta, W, Mo, or the like in a thickness of 1 nm or less, and an amorphous ferromagnetic layer (approximately 0.6 to 2.0 nm) formed from a ferromagnetic material such as CoFeB, FeB, and CoB on a ferromagnetic layer in this order. In this case, the barrier layer 11 formed from MgO (100) is caused to epitaxially grow on the amorphous ferromagnetic material, in-plane uniformity in orientation of MgO (100) is improved, and uniformity of resistance variation rate (MR variation rate) can be improved. In addition, the magnetization of the amorphous ferromagnetic layer is ferromagnetically coupled with the magnetization of the ferromagnetic layer that faces the amorphous ferromagnetic layer with a non-magnetic layer interposed therebetween due to the interlayer interaction, and the magnetizations are directed in the vertical direction. Note that, the amorphous ferromagnetic layer represents an amorphous layer or a thin film formed from a ferromagnetic material, and also includes a layer having a crystal in a part in a case where amorphous is dominant.

The recording layer 10 may be an epitaxial layer formed by epitaxial growth. In a case where the recording layer 10 is set as the epitaxial layer, the barrier layer in which a single crystal is dominant is formed by epitaxially growing the barrier layer 11 on the recording layer 10 that is the epitaxial layer, or by separately forming the barrier layer 11 that is the epitaxial layer and by laminating the barrier layer 11 onto the recording layer 10.

The reference layer 12 is a three-layer stacked film in which a ferromagnetic layer 14, a non-magnetic layer 15, and a ferromagnetic layer 16 are stacked on the barrier layer 11 in this order, and has a three-layer stacked ferri structure. Accordingly, a direction of a magnetization M14 of the ferromagnetic layer 14 and a direction of a magnetization M16 of the ferromagnetic layer 16 are anti-parallel, the magnetization M14 is directed to the −z-direction, and the magnetization M16 is directed to the +z-direction. In this specification, in a case where the magnetization directions are anti-parallel, this case represents that the magnetization directions are different by approximately 180°, and it is assumed that a case where a magnetization is directed in the +z-direction is referred to as upward, and a case where the magnetization is directed in the −z-direction is referred to as downward.

In this embodiment, the material and the thickness of the ferromagnetic layer 14 are selected so that the interface magnetic anisotropy occurs at an interface between the ferromagnetic layer 14 of the reference layer 12 on the most barrier layer 11 side and the barrier layer 11, and a magnetization direction of the ferromagnetic layer 14 is set to be the vertical direction. In addition, as described above, the reference layer 12 is set as the stacked ferri structure, and the magnetization M14 of the ferromagnetic layer 14 and the magnetization M16 of the ferromagnetic layer 16 are anti-ferromagnetically coupled to fix the magnetization M14 and the magnetization M16 in the vertical direction. In this manner, the magnetization of the reference layer 12 is fixed in the vertical direction. Note that, the direction of the magnetization M14 and the magnetization M16 may be fixed in the vertical direction by ferromagnetically coupling the magnetization M14 of the ferromagnetic layer 14 and the magnetization M16 of the ferromagnetic layer 16 by the interlayer interaction to fix the magnetization direction.

In this embodiment, the magnetization M14 is fixed downward and the magnetization M16 is fixed upward, but the magnetization M14 may be fixed upward and the magnetization M16 may be fixed downward. In addition, the direction of the magnetization M14 and the magnetization M16 may be fixed in the vertical direction by setting the magnetization direction of the ferromagnetic layer 14 and the ferromagnetic layer 16 to the vertical direction by crystal magnetic anisotropy or shape magnetic anisotropy, and by antiferromagnetically coupling the magnetization M14 of the ferromagnetic layer 14 and the magnetization M16 of the ferromagnetic layer 16 by the interlayer interaction to fix the magnetization direction.

The ferromagnetic layer 14 and the ferromagnetic layer 16 may be formed from the same material as in the recording layer 10, and the non-magnetic layer 15 may be formed from Ir, Rh, Ru, Os, Re, alloys of these elements, or the like. The non-magnetic layer 15 is formed in a thickness of approximately 0.5 to 1.0 nm in the case of Ru, in a thickness of approximately 0.5 to 0.8 nm in the case of Ir, in a thickness of approximately 0.7 to 1.0 nm in the case of Rh, in a thickness of approximately 0.75 to 1.2 nm in the case of Os, and in a thickness of approximately 0.5 to 0.95 in the case of Re. In this embodiment, the reference layer 12 is configured to include the ferromagnetic layer 14: Co—Fe—B (1.5 nm)/Ta (0.4 nm)/Co (0.6 nm)/(Pt (0.8 nm)/Co (0.25 nm))$_3$/Pt (0.8 nm)/Co (1.0) nm from the barrier layer 11 side, the non-magnetic layer 15: Ru (0.85 nm), and the ferromagnetic layer 16: Co 1.0 nm/(Pt 0.8 nm/Co 0.25 nm)$_{13}$ from the non-magnetic layer side, and the ferromagnetic layer 14 is set to Co—Fe—B to set the magnetization direction of the ferromagnetic layer 14 to the vertical direction due to the interface magnetic anisotropy. Note that, the number "$_3$" after parentheses in description of "(Pt (0.8 nm)/Co (0.25 nm))$_3$" represents that the two-layer film of Pt (0.8 nm)/Co (0.25 nm) is repetitively stacked three times (that is, a film of a total of six layers). This is also true of "$_{13}$" in description of "(Pt 0.8 nm/Co 0.25 nm)$_{13}$".

As described above, the ferromagnetic layer 14 may be a three-layer film in which an amorphous ferromagnetic layer (approximately 0.6 to 2.0 nm) formed from, for example, Co—Fe—B, Fe—B, Co—B, or the like, a non-magnetic layer (1 nm or less) containing Ta, W, Mo, or the like, and a ferromagnetic layer are sequentially stacked on the barrier layer 11. The amorphous ferromagnetic layer and the ferromagnetic layer of the ferromagnetic layer 14 are ferromagnetically coupled due to the interlayer interaction. For example, the ferromagnetic layer 14 is configured like an amorphous ferromagnetic layer: Co—Fe—B (1.5 nm)/a non-magnetic layer: Ta (0.5 nm)/a ferromagnetic layer: a crystalline ferromagnetic layer having vertical magnetic anisotropy. In this configuration, a magnetization direction of the amorphous ferromagnetic layer becomes the vertical direction, a magnetization direction of the ferromagnetic layer that faces the amorphous ferromagnetic layer with the non-magnetic layer interposed therebetween also becomes the vertical direction, and thus a magnetization direction of the ferromagnetic layer 14 can be set to the vertical direction.

The insulating layer 5 is provided on a rear surface (a surface of the heavy metal layer 2 which is opposite to the magnetic recording unit 3) of the heavy metal layer 2, which is a surface opposite to the front surface of the heavy metal layer 2 on which the magnetic recording unit 3 is provided, on a lower side of the magnetic recording unit 3. The insulating layer 5 is disposed at a position facing the recording layer 10 with the heavy metal layer 2 interposed therebetween, and substantially covers a bottom surface (a surface of the magnetic recording unit 3 which is in contact with the heavy metal layer 2) of the magnetic recording unit 3. In this embodiment, the insulating layer 5 is a circular column-shaped thin film of which a cross-sectional shape cut in an in-plane direction is the same circular shape as in the magnetic recording unit 3, and is disposed so that a central axis of the circular column-shaped magnetic recording unit 3 and a central axis of the circular column-shaped insulating layer 5 overlap each other. The insulating layer 5 may cover the entirety of the bottom surface of the magnetic recording unit 3, and it is preferable that the insulating layer 5 is manufactured to be slightly larger than a size of the recording layer 10 in consideration of alignment system in processing.

For example, the insulating layer 5 is preferably an insulating film formed from an insulator with a high dielectric constant (high-dielectric-constant insulator) such as a High-k material, and is provided on the rear surface of the heavy metal layer 2. More specifically, the insulating layer 5 is more preferably formed a High-k material (x>0, y>0) such as AlO$_x$, HfSiO$_x$, N-added HfSiO$_x$, HfAlO$_x$, N-added HfAlO$_x$, HfO$_2$Y$_2$O$_3$, HfO$_x$, and LaAlO$_x$. In addition, it is preferable that the insulating layer 5 is formed from a High-k material but may be formed from a typical insulator such as SiO$_x$, SiN$_x$, and SiO$_x$N$_y$ (x>0, y>0). A relative dielectric constant of the insulator with a high dielectric constant is approximately 10 to 30.

It is preferable that the thickness of the insulating layer 5 is set to a thickness at which a tunnel current or a leak current does not flow to the insulating layer 5 or the insulating layer 5 is not subjected to insulation breakdown when a voltage is applied to the heavy metal layer 2 from a first terminal T1 to be described later through the insulating layer 5. The thickness of the insulating layer 5 also depends on a material that is used or an applied voltage. However, the thickness is preferably about 1.5 nm or more and 100 nm or less, and more preferably 2.0 nm or more 10 nm or less. Note that, in this embodiment, the insulating layer 5 is formed as a two-layer film of HfO$_x$/SiO$_x$ from the heavy metal layer 2 side, and the thickness thereof is set to 2 nm and 1 nm, respectively. In this manner, since the magnetoresistance effect element 1 includes the insulating layer 5 on the rear surface of the heavy metal layer 2, it is possible to apply a voltage to the heavy metal layer 2 between the insulating layer 5 and the magnetic recording unit 3 by applying a voltage to the insulating layer 5, and it is possible to cause an electric field to occur. If a desired electric field can be applied to the heavy metal layer 2, when the film thickness of the insulating layer 5 is as thin as possible in a range in which the tunnel current or the leak current does not flow to the insulating layer 5 or the insulating layer 5 is not subjected to the insulation breakdown, an application voltage can be reduced, and power consumption can be reduced.

The insulating layer 5 is manufactured by depositing an insulator on a base layer or a circuit substrate by a typical film formation method such as CVD, and shaping the insulator to a desired shape (a circular column shape in this embodiment) by a lithography technology. In a case where the first terminal T1 is provided, for example, Cu is deposited and the insulator is subsequently deposited, and then the first terminal T1 and the insulating layer 5 are shaped by lithography or the like. For example, the insulating layer 5 is formed on a drain terminal wiring of a transistor on the circuit substrate into which an FET-type transistor is embedded. In addition, the heavy metal layer 2 and the magnetic recording unit 3 are formed on the insulating layer 5. Actually, after shaping the insulating layer 5, an interlayer insulating film having the same height as that of the insulating layer 5 is formed at the periphery of the insulating layer 5, a planarization treatment is performed, and the heavy metal layer 2 is formed.

Four terminals (the first terminal T1, a second terminal T2, a third terminal T3, and a fourth terminal T4), from which a voltage is applied or a current flows for a write operation or a read operation, are connected to the magnetoresistance effect element 1. The magnetoresistance effect element 1 is a four-terminal element. The first terminal T1, the second terminal T2, the third terminal T3, and the fourth terminal T4 are members formed from a metal such as Cu, Al, and Au which have conductivity, and the shape thereof is not particularly limited.

The first terminal T1 is provided in contact with the insulating layer 5 on a lower side of the insulating layer 5, that is, at a position facing the magnetic recording unit 3 with the insulating layer 5 and the heavy metal layer 2 interposed therebetween. In this embodiment, the first terminal T1 is a circular column-shaped thin film of which a cross-sectional shape cut in the in-plane direction is the same circular shape as in the insulating layer 5, and is disposed on a surface of the insulating layer 5, which is on a rear side of a surface that is in contact with the heavy metal layer 2, to cover the entirety of the rear surface. In addition, in this embodiment, an FET-type first transistor Tr1 is connected to the first terminal T1. In the first transistor Tr1, a drain is connected to the first terminal T1, a source is connected to a write bit line (not illustrated), and a gate is connected to a control device (not illustrated). The control device applies a gate voltage to the gate of the first transistor Tr1, and controls ON and OFF of the first transistor Tr1. The write bit line is also connected to the control device, and thus the control device controls a voltage level of the write bit line. A voltage level of the write bit line is set to $V_{Assist}$, and when the first transistor Tr1 is turned on, a write assist voltage $V_{Assist}$ for reversing the magnetization M10 of the recording layer 10 of the magnetic recording unit is applied to the heavy metal layer 2 through the insulating layer 5. In this manner, the first terminal T1 is connected to the insulating layer 5, and applies a voltage to the heavy metal layer 2 through the insulating layer 5.

The second terminal T2 is provided on the reference layer 12 of the magnetic recording unit 3 in contact with the reference layer 12 (the ferromagnetic layer 16 thereof), and is connected to the reference layer 12. In this embodiment, the second terminal T2 is a circular column-shaped thin film of which a cross-sectional shape cut in the in-plane direction is the same circular shape as in the magnetic recording unit 3, and is disposed on an upper surface of the magnetic recording unit 3 to cover the entirety of the upper surface. In addition, in this embodiment, an FET-type second transistor Tr2 is connected to the second terminal T2. In the second transistor Tr2, a drain is connected to the second terminal T2, a source is connected to a read bit line (not illustrated), and a gate is connected to the control device. The control device applies a gate voltage to the gate of the second transistor Tr2, and controls ON and OFF of the second transistor Tr2. A read bit line is also connected to the control device, and the control device controls a voltage level of the read bit line. A voltage level of the read bit line is set to $V_{Read}$, and when the second transistor Tr2 is turned on, a read voltage $V_{Read}$ is applied to the second terminal T2.

The third terminal T3 and the fourth terminal 14 are provided in one end and in the other end of the heavy metal layer 2 so that the magnetic recording unit 3 is disposed between the both terminals. In this embodiment, the third terminal T3 is provided on a surface of the one end of the heavy metal layer 2 in a first direction, and the fourth terminal T4 is provided on a surface of the other end of the heavy metal layer 2 in the first direction. The third terminal T3 is connected to an FET-type third transistor Tr3, and the fourth terminal T4 is connected to a ground. In the third transistor Tr3, a drain is connected to the third terminal T3, a source is connected to a control line (not illustrated), and a gate is connected to the control device. The control device applies a gate voltage to the gate of the third transistor Tr3, and controls ON and OFF of the third transistor Tr3. A control line is also connected to the control device, and the control device controls a voltage level of the control line.

The voltage level of the control line is set to $V_W$, and when the third transistor Tr3 is turned on, a write voltage $V_W$ is applied to the third terminal T3, and a write current Iw flows between the third terminal T3 and the fourth terminal T4 in the first direction. In this manner, the third terminal T3 and the fourth terminal T4 are connected to the heavy metal layer 2 (one end and the other end thereof), and allow the write current Iw to flow to the heavy metal layer 2 between the magnetic recording unit 3 and the insulating layer 5. In addition, when the second transistor Tr2 and the third transistor Tr3 are turned on, a read current Ir for reading a resistance value of the magnetic recording unit 3 flows between the second terminal T2 and the third terminal T3 in correspondence with a potential difference of the second terminal T2 and the third terminal T3. In this embodiment, since $V_W$ is set to be higher than $V_{Read}$, the read current Ir can be caused to flow to the second terminal T2 from the third terminal T3 through the heavy metal layer 2 and the magnetic recording unit 3.

As described above, in this embodiment, the third terminal T3 and the fourth terminal T4 are provided on the front surface (surface on which the magnetic recording unit 3 is provided) of the heavy metal layer 2, and contact from an upper side to the magnetoresistance effect element 1 is made, but there is no limitation thereto. For example, the third terminal T3 and the fourth terminal 14 may be provided on the rear surface (surface on a rear side of the surface on which the magnetic recording unit 3 is provided) of the heavy metal layer 2, and contact from a lower side to the magnetoresistance effect element 1 may be made.

(1-2) Write Method and Read Method for Magnetoresistance Effect Element

Description will be given of a write method for the magnetoresistance effect element 1 with reference to FIG. 2A, FIG. 2B, FIG. 2C, and FIG. 2D in which the same reference numeral is given to the same configuration as in FIG. 1A and FIG. 1B. In the magnetoresistance effect element 1, resistance of the magnetic recording unit 3 varies depending on whether magnetization directions of the recording layer 10 and the reference layer 12 are parallel or anti-parallel. Actually, in the magnetoresistance effect element 1, since the reference layer 12 is a stacked film, the resistance of the magnetic recording unit 3 varies depending on whether the magnetization direction of the recording layer 10 and the magnetization direction of the ferromagnetic layer 14 of the reference layer 12 which is in contact with the barrier layer 11 are parallel or anti-parallel. In addition, in a case where the recording layer 10 is also a stacked film, the resistance of the magnetic recording unit 3 varies depending on whether the magnetization direction of the ferromagnetic layer of the recording layer 10 which is in contact with the barrier layer 11, and the magnetization direction of the ferromagnetic layer 14 of the reference layer 12 which is in contact with the barrier layer 11 are parallel or anti-parallel.

In this specification, in a case where the recording layer 10 and the reference layer 12 are in a parallel state, it is assumed that this case also include a state in which the magnetization direction of the ferromagnetic layer of the recording layer 10 which is in contact with the barrier layer 11, and the magnetization direction of the ferromagnetic layer 14 of the reference layer 12 which is in contact with the barrier layer 11 are parallel in a stacked film of the recording layer 10 and the reference layer 12. In addition, in a case where the recording layer 10 and the reference layer 12 are in an anti-parallel state, it is assumed that this case indicates a state in which the magnetization direction of the ferromagnetic layer of the recording layer 10 which is in contact with the barrier layer 11, and the magnetization direction of the ferromagnetic layer 14 of the reference layer 12 which is in contact with the barrier layer 11 are anti-parallel in the stacked film of the recording layer 10 and the reference layer 12.

In the magnetoresistance effect element 1, one-bit data of "0" and one-bit data of "1" are allocated to the parallel state and the anti-parallel state, respectively, by using a situation in which a resistance value of the magnetic recording unit 3 is different between the parallel state and the anti-parallel state, thereby storing data in the magnetoresistance effect element 1. In the magnetoresistance effect element 1, since the magnetization direction of the recording layer 10 is reversible, the magnetization direction of the recording layer 10 is reversed to transition the magnetization state of the magnetic recording unit 3 between the parallel state and the anti-parallel state. According to this, "1" is stored in the magnetic recording unit 3 (hereinafter, also referred to as "bit") that stored "0", and "0" is stored in a bit that stored "1". In this specification, a statement in which the resistance value of the magnetic recording unit 3 is changed through reversal of the magnetization direction of the recording layer 10 is also referred to as "data is written".

The write method for the magnetoresistance effect element 1 will be described in more detail. In this embodiment, the heavy metal layer 2 is formed from Pt—Au in which the sign of the spin hall angle is positive. Here, description will be given of an example in which the spin hall angle of the heavy metal layer 2 is positive. In a case where the spin hall angle of the heavy metal layer 2 is negative, it is possible to control a spin direction of the recording layer 10 by either reversing a direction of the following write current Iw or reversing a sign of a write assist voltage $V_{Assist}$. Description will be given of a case where data "0" is written to magnetoresistance effect element 1 that is storing data "1".

In this case, it is assumed that in an initial state, the magnetoresistance effect element 1 is storing data "1", a magnetization direction of the recording layer 10 is upward, a magnetization direction of the ferromagnetic layer 14 of the reference layer 12 which is in contact with the barrier layer 11 is downward, and the magnetic recording unit 3 is in an anti-parallel state. In addition, it is assumed that the first transistor Tr1, the second transistor Tr2, and the third transistor Tr3 are turned off.

Figure 2A:
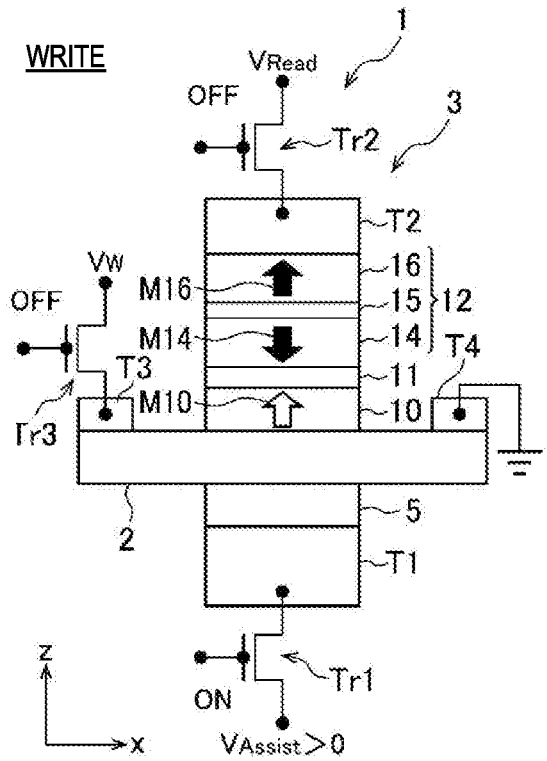
FIG. 2A is a schematic cross-sectional view describing a method of writing data "0" to a magnetoresistance effect element that is storing data "1" and illustrates a state in which a voltage is applied to a heavy metal layer through an insulating layer.

First, as illustrated in FIG. 2A, the magnetoresistance effect element 1 turns on only the first transistor Tr1, and a positive write assist voltage $V_{Assist}$ is applied from the first terminal T1 to the heavy metal layer 2 through the insulating layer 5. As a result, an electric field in the −z-direction occurs in the heavy metal layer 2. The magnitude of the write assist voltage $V_{Assist}$ is appropriately adjusted in correspondence with a material or the thickness of the insulating layer 5, and the magnitude of the write current Iw. In this embodiment, the insulating layer 5 is formed in a two-layer film of $HfO_x$ (2 nm)/$SiO_x$ (1 nm), and thus the write assist voltage $V_{Assist}$ is set to, for example, 1.5 V. Note that, at this time, since the second transistor Tr2 is turned off, even when a voltage is applied to the heavy metal layer 2 through the insulating layer 5, the voltage is not applied to the barrier layer 11.

Figure 2B:
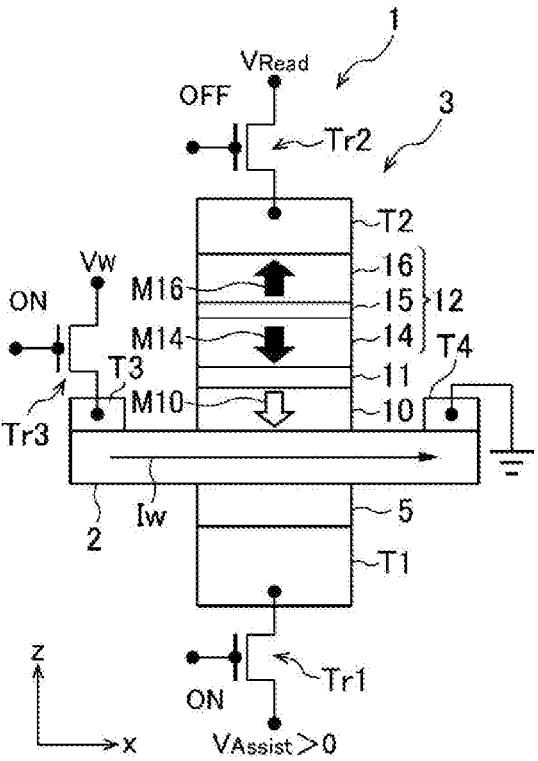
FIG. 2B is a schematic cross-sectional view describing a method for writing data "0" to the magnetoresistance effect element that is storing data "1" and illustrates a state in which data is written by causing a write current to flow.

Next, as illustrated in FIG. 2B (in FIG. 2B, a magnetization direction of the recording layer 10 after writing is illustrated), the first transistor Tr1 is retained to the ON state, the third transistor Tr3 is turned on, and a write voltage $V_W$ is applied to the third terminal T3. At this time, since the write voltage $V_W$ is set to be higher than a ground voltage, the write current Iw flows from the third terminal T3 to the fourth terminal 14 through the heavy metal layer 2, and the write current Iw flows from one end of the heavy metal layer 2 to the other end in the +x-direction. Since the insulating layer 5 is provided, the current does not flow from the third terminal T3 to the first terminal T1. In addition, since the second transistor Tr2 is turned off, the current also does not flow from the third terminal T3 to the second terminal T2 through the magnetic recording unit 3. In this embodiment, the write current Iw flows between the one end and the other end of the heavy metal layer 2. The write current Iw is a pulse current, and a pulse width can be changed by adjusting time for which the third transistor Tr3 is turned on.

When the write current Iw flows to the heavy metal layer 2, a spin current (spin angular motion current) occurs in the heavy metal layer 2 due to a spin hall effect by a spin orbit interaction, and spins directed to a paper-surface front side (−y-direction in FIG. 1A) flow to the upper surface side (+z-direction) of the heavy metal layer 2, spins which are anti-parallel to the spins in a direction and are directed to a paper surface depth side (+y-direction in FIG. 1A) flow to the lower surface side (−z-direction) of the heavy metal layer 2, and the spins are unevenly distributed in the heavy metal layer 2.

At this time, in the heavy metal layer 2 interposed between the insulating layer 5 and the recording layer 10, an electric field in the −z-direction occurs and electrons flow in the −x-direction, and thus an effective magnetic field occurs due to a Rashba effect, and spins which are unevenly distributed perform precessional motion due to the effective magnetic field. When the spins having performed the precessional motion flow into the recording layer 10 due to the spin current flowing through the heavy metal layer 2, the magnetization M10 of the recording layer 10 is likely to be reversed to a predetermined direction, and an upward magnetization M10 is reversed to downward due to torque from the spins having performed the processional motion, and it enters a parallel state. In this manner, when a voltage is applied to the heavy metal layer 2 through the insulating layer 5 and the write current Iw flows to the heavy metal layer 2, the magnetization of the recording layer 10 is reversed. The first transistor Tr1 is turned off after the third transistor Tr3 is turned off. That is, after the write current Iw is set to OFF, application of the write assist voltage $V_{Assist}$ is set to OFF.

Next, description will be given of a case where data "1" is written to the magnetoresistance effect element 1 that is storing data "0".

In this case, it is assumed that in an initial state, the magnetoresistance effect element 1 is storing data "1", a magnetization direction of the recording layer 10 is downward, a magnetization direction of the ferromagnetic layer 14 of the reference layer 12 which is in contact with the barrier layer 11 is downward, and the magnetic recording unit 3 is in a parallel state. In addition, it is assumed that the first transistor Tr1, the second transistor Tr2, and the third transistor Tr3 are turned off.

Figure 2C:
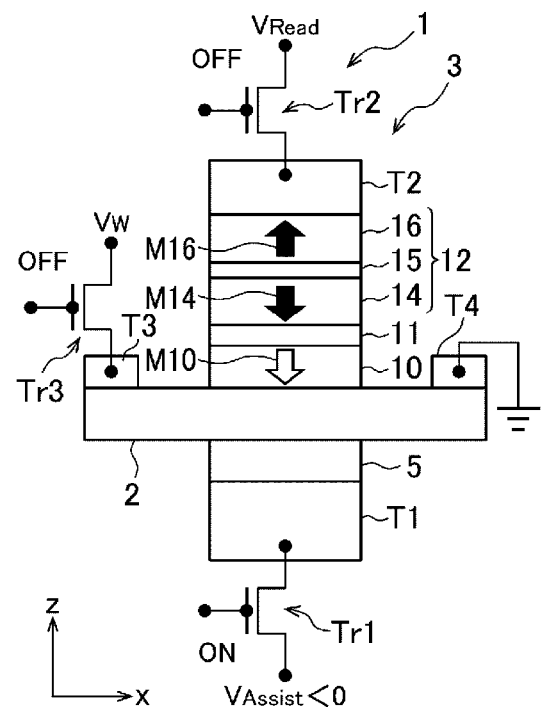
FIG. 2C is a schematic cross-sectional view describing a method for writing data "1" to the magnetoresistance effect element that is storing data "0" and illustrates a state in which a voltage is applied to the heavy metal layer through the insulating layer.

First, as illustrated in FIG. 2C, only the first transistor Tr1 is turned on, and a negative write assist voltage $V_{Assist}$ is applied from the first terminal T1 to the heavy metal layer 2 through the insulating layer 5. As a result, an electric field in the +z-direction occurs in the heavy metal layer 2.

Figure 2D:
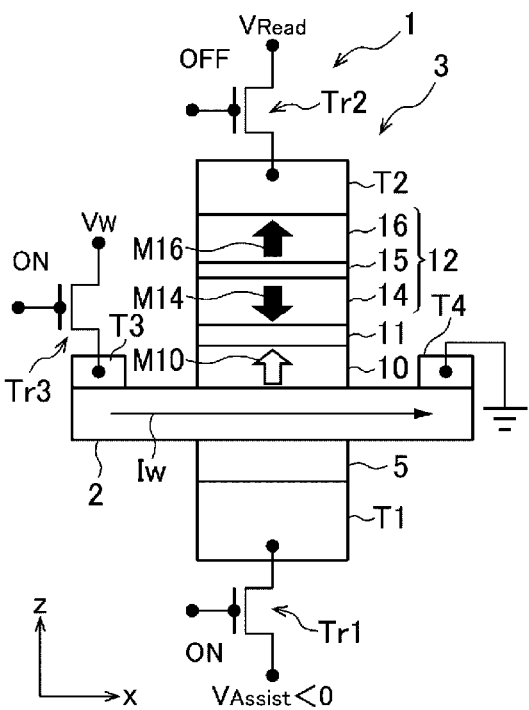
FIG. 2D is a schematic cross-sectional view describing a method for writing data "1" to the magnetoresistance effect element that is storing data "0" and illustrates a state in which data is written by causing a write current to flow.

Next, as illustrated in FIG. 2D (in FIG. 2D, a magnetization direction of the recording layer 10 after writing is illustrated), the first transistor Tr1 is retained to the ON state, the third transistor Tr3 is turned on, and the write voltage $V_W$ is applied to the third terminal T3. At this time, since the write voltage $V_W$ is set to be higher than a ground voltage, the write current Iw flows from the third terminal T3 to the fourth terminal 14 through the heavy metal layer 2, and the write current Iw flows from one end of the heavy metal layer 2 to the other end in the +x-direction.

When the write current Iw flows to the heavy metal layer 2, a spin current (spin angular motion current) occurs in the heavy metal layer 2 due to a spin hall effect by a spin orbit interaction, and spins directed to a paper-surface front side (−y-direction in FIG. 1A) flow to the upper surface side (+z-direction) of the heavy metal layer 2, spins which are anti-parallel to the spins in a direction and are directed to a paper surface depth side (+y-direction in FIG. 1A) flow to the lower surface side (−z-direction) of the heavy metal layer 2, and the spins are unevenly distributed in the heavy metal layer 2.

At this time, in the heavy metal layer 2 interposed between the insulating layer 5 and the recording layer 10, an electric field in the +z-direction occurs and electrons flow in the −x-direction, and thus an effective magnetic field occurs due to a Rashba effect, and spins which are unevenly distributed due to the effective magnetic field perform precessional motion. When the spins having performed the precessional motion flow into the recording layer 10 due to the spin current flowing through the heavy metal layer 2, the magnetization M10 of the recording layer 10 is likely to be reversed to a predetermined direction, and a downward magnetization M10 is reversed to upward due to torque from the spins having performed the processional motion, and it enters an anti-parallel state. In addition, the first transistor Tr1 is turned off after the third transistor Tr3 is turned off. That is, after the write current Iw is set to OFF, application of the write assist voltage $V_{Assist}$ is set to OFF.

In this manner, in the magnetoresistance effect element 1, the voltage is applied to the heavy metal layer 2 through the insulating layer 5, and the write current Iw flows between the one end and the other end of the heavy metal layer 2, and thus the magnetization direction of the recording layer 10 of the magnetic recording unit 3 is reversed, and data "0" or data "1" can be written.

In an SOT-MRAM element in the related art, a voltage is applied to one end and the other end of a heavy metal layer, a write current is caused to flow to the heave metal layer, and a voltage is applied to an MTJ to reduce magnetic anisotropy of a recording layer. According to this, magnetization of the recording layer is reversed due to spins injected from the heavy metal layer. According to this, a current flows to the MTJ in writing. On the other hand, in the magnetoresistance effect element 1 of this embodiment, in a write operation, the second transistor Tr2 is always turned off, and thus a voltage is not applied to the MTJ of the magnetic recording unit 3, and a current also does not flow to the MTJ. In addition, in the magnetoresistance effect element 1, even when a voltage is applied to the heavy metal layer 2 through the insulating layer 5, a voltage is not applied to the barrier layer 11.

As described above, in the magnetoresistance effect element 1, even though a voltage is not applied to the magnetic recording unit 3 for writing data differently from the magnetoresistance effect element in the related art, a voltage is applied to the heavy metal layer 2 through the insulating layer 5 and the write current Iw is caused to flow to the heavy metal layer 2, and thus the magnetization of the recording layer 10 of the magnetic recording unit 3 can be reversed. According to this, in the magnetoresistance effect element 1, in writing, since a voltage is not applied to the barrier layer 11 of the magnetic recording unit 3 and a current also does not flow thereto, the resistance value of the magnetic recording unit 3 can be made small by reducing the thickness of the barrier layer 11, time necessary for a write operation can be shortened, and high speed of the magnetoresistance effect element 1 can be realized.

In the SOT-MRAM element in the related art, in the case of using the MTJ in which the recording layer and the barrier layer are magnetized vertically with respect to an in-plane direction, if an external magnetic field is not applied to the MTJ by preparing a magnetic field application device or the like, the magnetization of the recording layer cannot be reversed, and data cannot be written. On the other hand, in the magnetoresistance effect element 1 of this embodiment, the write current Iw is caused to flow to the heavy metal layer 2, a voltage is applied to the heavy metal layer 2 through the insulating layer 5, spins unevenly distributed is caused to perform precessional motion due to the effective magnetic field occurred by the Rashba effect, and the spins performing the precessional motion are injected to the recording layer 10 by the spin current. According to this, the magnetization of the recording layer 10 that is magnetized in the vertical direction can be reversed due to the spins having performed the precession motion, and thus the magnetization of the recording layer 10 can be reversed without applying an external magnetic field, and data can be written. In addition, it is not necessary to prepare the magnetic field application device, and thus space saving can be realized.

Figure 3:
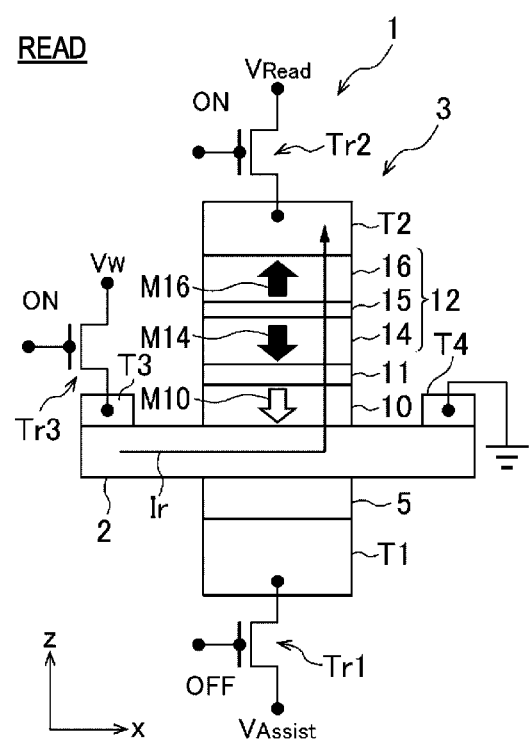
FIG. 3 is a schematic cross-sectional view describing a method for reading data stored in the magnetoresistance effect element.

Next, a read method will be described with reference to FIG. 3. At this time, it is assumed that in an initial state, all transistors are turned on. In reading, the second transistor and the third transistor are turned on, a read voltage $V_{Read}$ is applied to the second terminal T2, and the write voltage $V_W$ is applied to the third terminal T3. At this time, since the read voltage $V_{Read}$ is set to be lower than the write voltage $V_W$, the read current Ir flows from the third terminal T3 to the heavy metal layer 2, the recording layer 10, the barrier layer 11, the reference layer 12, and the second terminal T2 in this order. The magnitude of the read current Ir varies depending on the resistance value of the magnetic recording unit 3, and thus a situation as to whether the magnetic recording unit 3 is in a parallel state or an anti-parallel state, that is, whether the magnetic recording unit 3 is storing data "0" or data "1" can be read from the magnitude of the read current Ir. The read current Ir is a pulse current, and a pulse width is adjusted by adjusting time for which the second transistor Tr2 is turned on.

It is preferable that the read current Ir is set to a weak current to a certain extent in which the recording layer 10 is not subjected to spin injection magnetization reversal due to the read current Ir when the read current Ir flows to the magnetic recording unit 3. The magnitude of the read current Ir is adjusted by appropriately adjusting a potential difference between the write voltage $V_W$ and the read voltage $V_{Read}$. In addition, it is preferable that the third transistor Tr3 is turned on to set the write voltage $V_W$ to ON, and then the second transistor Tr2 is turned on to set the read voltage $V_{Read}$ to ON. In this case, it is possible to suppress a current from flowing to the fourth terminal T4 from the second terminal T2 through the magnetic recording unit 3, and it is possible to suppress a current other than the read current from flowing to the magnetic recording unit 3.

Then, the second transistor Tr2 is turned off, and then the third transistor Tr3 is turned off. Since the third transistor Tr3 is turned off after the second transistor Tr2, that is, the write voltage $V_W$ is set to OFF after the read voltage $V_{Read}$, it is possible to suppress a current corresponding to a potential difference between the read voltage $V_{Read}$ and the ground voltage from flowing from the second terminal T2 to the fourth terminal T4 through the magnetic recording unit 3 and the heavy metal layer 2. Accordingly, in the magnetoresistance effect element 1, the barrier layer 11 can be protected, the barrier layer 11 can also be made thin, and it is possible to suppress Read disturb in which a magnetization state of the recording layer 10 is changed due to current flowing through the magnetic recording unit 3.

As described above, in the magnetoresistance effect element 1, the voltage $V_{Assist}$ is applied to the first terminal T1 in writing, the read voltage $V_{Read}$ is applied to the second terminal T2 in reading, a voltage control line in writing and a voltage control line in reading are different from each other, and thus it is possible to construct a Read disturb free and Write disturb free memory array.

In the magnetoresistance effect element 1, a sign of the write assist voltage $V_{Assist}$ and a direction in which the write current Iw is caused to flow vary depending on the magnetization direction of the recording layer 10 (a magnetization direction of the ferromagnetic layer that is in contact with the heavy metal layer in a case where the recording layer 10 is a stacked film). In a case where the magnetization M10 of the recording layer 10 is upward, the write assist voltage $V_{Assist}$ is set to positive, and the write current Iw is caused to flow in the +x-direction, thereby reversing the upward magnetization M10 to downward. In addition, in a case where the magnetization M10 of the recording layer 10 is downward, the write assist voltage $V_{Assist}$ is set to negative, and the write current Iw is caused to flow in the +x-direction, thereby reversing the downward magnetization M10 to upward.

Figure 4A:
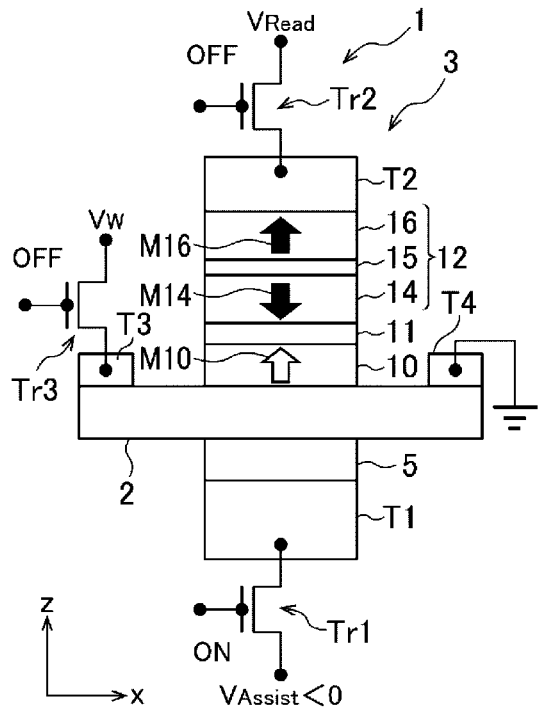
FIG. 4A is a schematic cross-sectional view describing another method for writing data "0" to the magnetoresistance effect element that is storing data "1" and illustrates a state in which a voltage is applied to the heavy metal layer through the insulating layer.
Figure 4B:
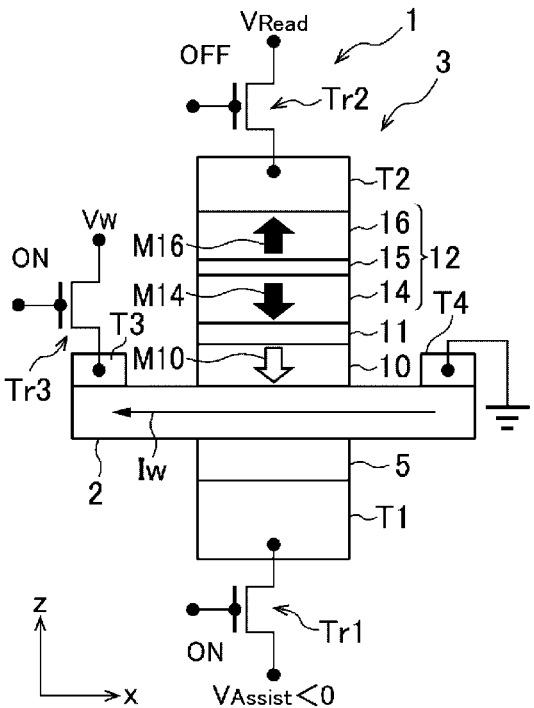
FIG. 4B is a schematic cross-sectional view describing another method for writing data "0" to the magnetoresistance effect element that is storing data "1" and illustrates a state in which data is written by causing a write current to flow.

On the other hand, in a case where the magnetization M10 of the recording layer 10 is upward, as illustrated in FIG. 4A and FIG. 4B (FIG. 4A illustrates a magnetization direction of the recording layer 10 before writing, and FIG. 4B illustrates a magnetization direction of the recording layer 10 after writing) in which the same reference numeral is given to the same configuration as in FIG. 2A and FIG. 2B, even in a case where the sign of the write assist voltage $V_{Assist}$ is set to negative, a negative voltage is applied to the heavy metal layer 2, and the write current Iw is caused to flow in the -x-direction, the upward magnetization M10 can be reversed to downward.

Figure 4C:
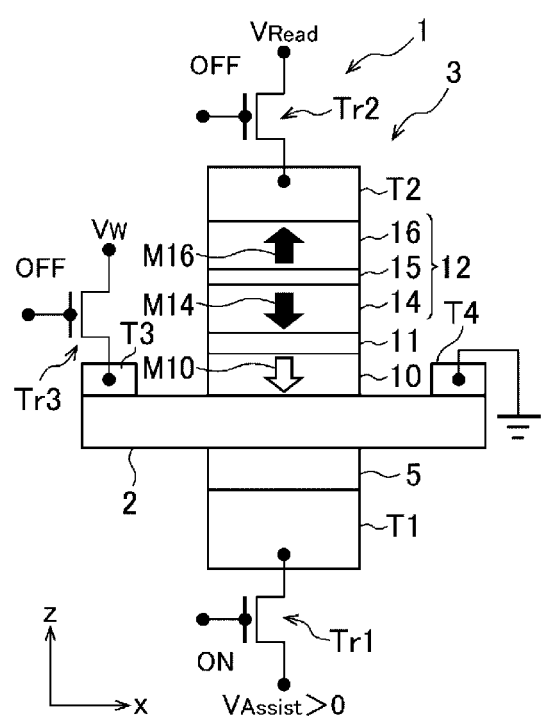
FIG. 4C is a schematic cross-sectional view describing another method for writing data "1" to the magnetoresistance effect element that is storing data "0" and illustrates a state in which a voltage is applied to the heavy metal layer through the insulating layer.
Figure 4D:
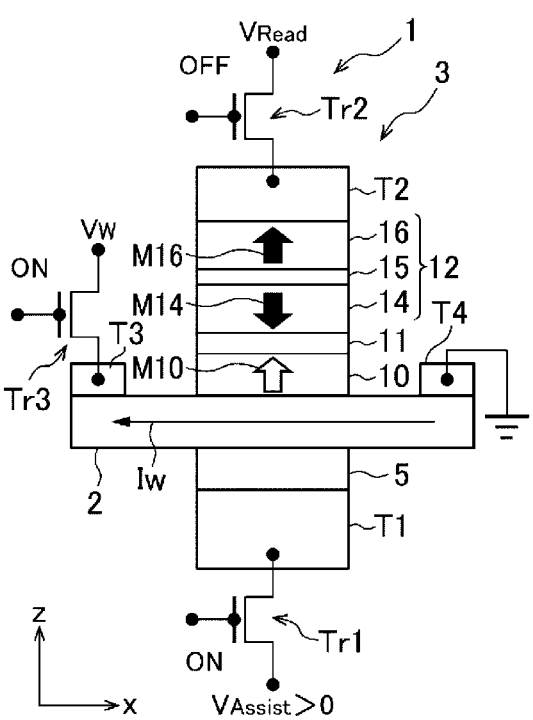
FIG. 4D is a schematic cross-sectional view describing another method for writing data "1" to the magnetoresistance effect element that is storing data "0" and illustrates a state in which data is written by causing a write current to flow.

In a case where the magnetization M10 is downward, as illustrated in FIG. 4C and FIG. 4D (FIG. 4C illustrates a magnetization direction before writing, and FIG. 4D illustrates a magnetization direction after writing) in which the same reference numeral is given to the same configuration as in FIG. 2A and FIG. 2B, when the sign of the write assist voltage $V_{Assist}$ is set to positive, a positive voltage is applied to the heavy metal layer 2, and the write current Iw is caused to flow in the -x-direction, the downward magnetization M10 can be reversed to upward.

In a case where the sign of the spin hall angle of a material constituting the heavy metal layer 2 is negative, in the respective cases, when any one of the sign of the write assist voltage $V_{Assist}$ and the direction in which the write current Iw is caused to flow is set to opposite, the magnetization of the recording layer 10 can be reversed. For example, in the case in FIG. 2A and FIG. 2B, the sign of the write assist voltage $V_{Assist}$ is set to negative, a negative voltage is applied to the heavy metal layer 2, and the write current Iw is caused to flow in the +x-direction, thereby reversing the upward magnetization M10 to downward.

Figure 5A:
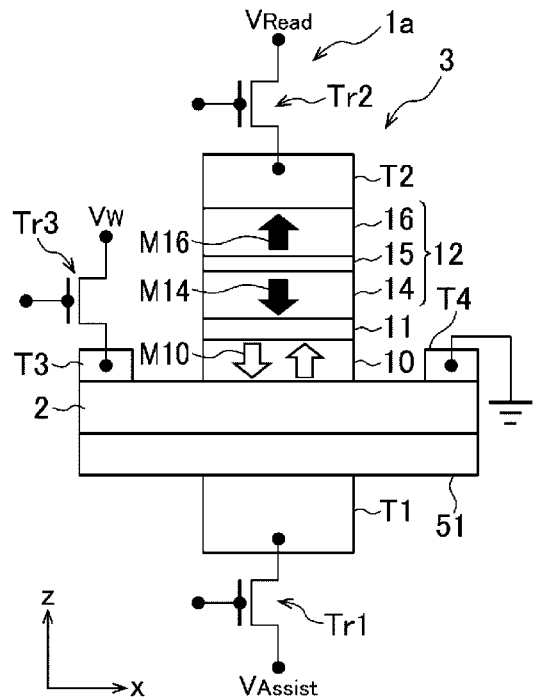
FIG. 5A is a schematic cross-sectional view illustrating a magnetoresistance effect element of a modification example of the invention.

(1-3) Modification Example of Magnetoresistance Effect Element of Embodiment of Invention In the above-described embodiment, description has been given of a case where the cross-sectional shape of the insulating layer 5 is set to the same circular shape as in the magnetic recording unit 3, and the insulating layer 5 covers the entirety of the bottom surface of the magnetic recording unit 3 on the rear surface of the heavy metal layer 2, but the invention is not limited to this case. A shape of the insulating layer 5 is not particularly limited as long as the insulating layer 5 can substantially cover the bottom surface of the magnetic recording unit 3 from the rear surface side of the heavy metal layer 2, and may be various shapes such as a triangular shape, a quadrangular shape, a polygonal shape of a quadrangle or greater, and an elliptical shape. In addition, in the insulating layer 5, a cross-sectional area in the in-plane direction may be larger than a cross-sectional area of the magnetic recording unit 3. For example, as in a magnetoresistance effect element 1a illustrated in FIG. 5A, a cross-sectional shape of an insulating layer 51 in the in-plane direction may be set to the same shape as in the heavy metal layer 2, and the insulating layer 51 may cover the entirety of a rear surface of the heavy metal layer 2. In this case, the insulating layer 51 and the heavy metal layer 2 can be continuously stacked, and a process of shaping the insulating layer to, for example, a circular column shape or the like can be omitted, and thus the magnetoresistance effect element can be manufactured in an easier manner.

Figure 5B:
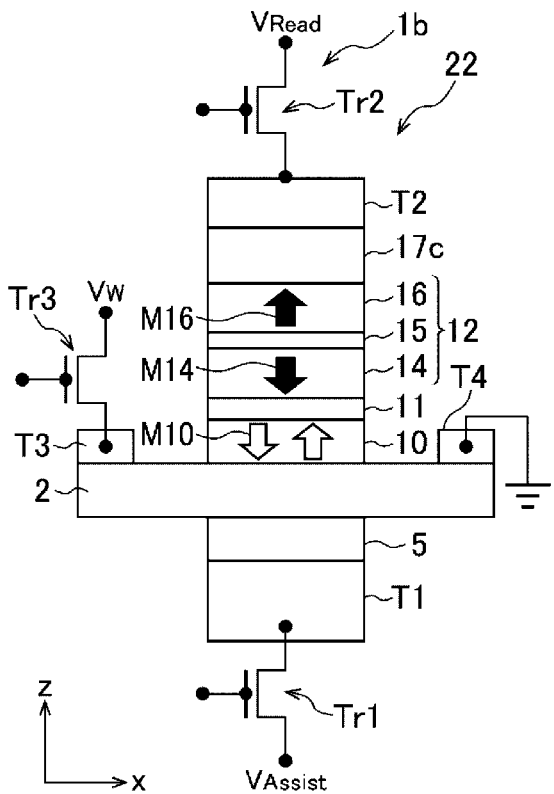
FIG. 5B is a schematic cross-sectional view illustrating a magnetoresistance effect element of another modification example of the invention.

As in a magnetoresistance effect element 1b illustrated in FIG. 5B, a diode 17c may be provided on the ferromagnetic layer 16 of the reference layer 12. In the diode 17c, an anode side is in contact with the ferromagnetic layer 16, and a cathode side is in contact with the second terminal T2, and thus a current is suppressed from flowing from the second terminal T2 to the heavy metal layer 2. In this case, in the read operation, since the read voltage $V_{Read}$ is higher than the ground voltage, the current is suppressed from flowing from the second terminal T2 to the fourth terminal 14 through the magnetic recording unit 3 and the heavy metal layer 2, and only the read current Ir can be caused to flow to the magnetic recording unit 3, and thus the thickness of the barrier layer 11 can be made smaller. Note that, a configuration of the diode 17c is not particularly limited. For example, the diode 17c may be a PN junction in which a P-type semiconductor layer and an N-type semiconductor layer are sequentially stacked on the ferromagnetic layer 16.

Figure 5C:
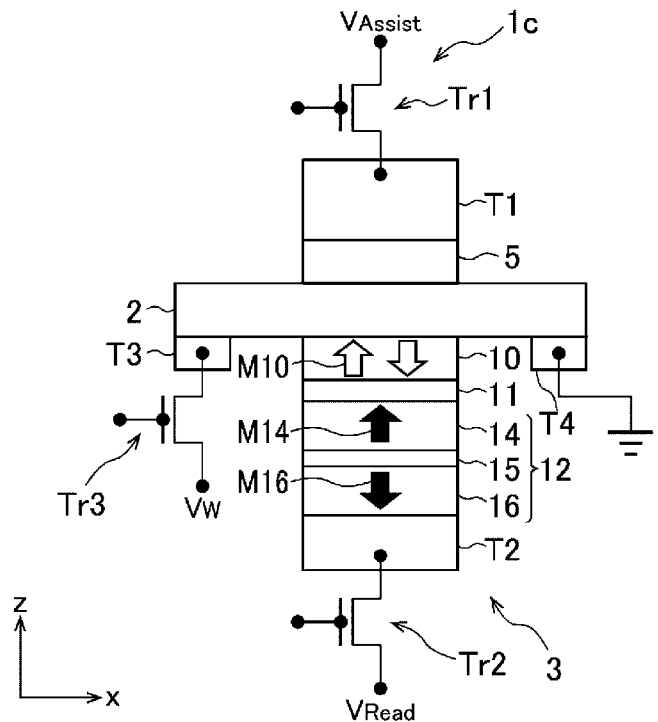
FIG. 5C is a schematic cross-sectional view illustrating a magnetoresistance effect element of still another modification example of the invention.

As in a magnetoresistance effect element 1c illustrated in FIG. 5C, it is possible to employ a configuration in which the second terminal T2, the magnetic recording unit 3, the heavy metal layer 2, the insulating layer 5, and the first terminal T1 are sequentially stacked on a circuit substrate (not illustrated), and the magnetic recording unit 3 is disposed on a lower side of the insulating layer 5 with the heavy metal layer 2 interposed therebetween. Even in this case, the recording layer 10 of the magnetic recording unit 3 is set to be in contact with the heavy metal layer 2.

Figure 5D:
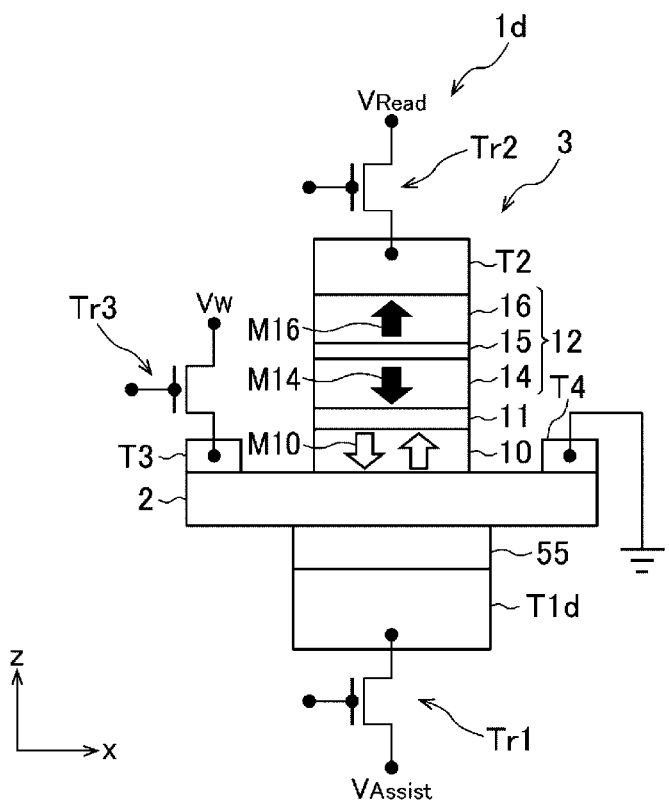
FIG. 5D is a schematic cross-sectional view illustrating a magnetoresistance effect element of still another modification example of the invention.

In the embodiment, description has been given of a case where the cross-sectional area of the insulating layer 5 and the first terminal T1 in the in-plane direction is set to be the same as the cross-sectional area of the magnetic recording unit 3 in the in-plane direction as illustrated in FIG. 1B, but there is no limitation to this case. For example, as in a magnetoresistance effect element 1d illustrated in FIG. 5D, a cross-sectional area of an insulating layer 55 and a first terminal T1d in the in-plane direction may be set to be greater than a cross-sectional area of the magnetic recording unit 3 in the in-plane direction. In this manner, in a magnetoresistance effect element, it is preferable that the cross-sectional area of the insulating layer 5 and the first terminal T1 in the in-plane direction is set to be greater than the cross-sectional area of the magnetic recording unit 3 in the in-plane direction, and a voltage is applied to the entirety of a lower portion of the magnetic recording unit 3. However, the cross-sectional area of the insulating layer 5 and the first terminal T1 in the in-plane direction may be set to be smaller than the cross-sectional area of the magnetic recording unit 3 in the in-plane direction. In addition, the insulating layer, the first terminal, and the magnetic recording unit may be formed in various columnar shapes such as a prism shape instead of the circular column shape. This is also true of the second terminal T2 formed in the same cross-sectional shape as in the magnetic recording unit 3.

Figure 5E:
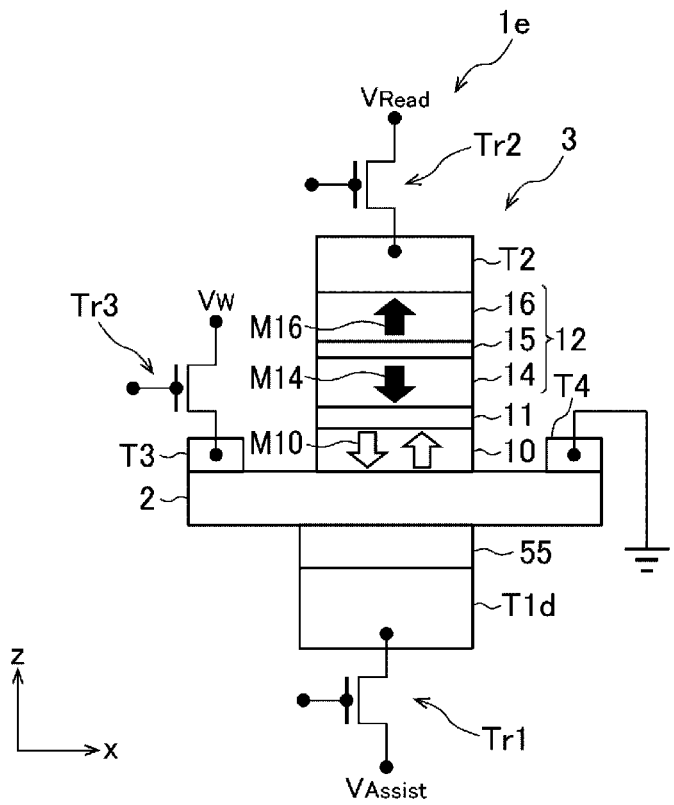
FIG. 5E is a schematic cross-sectional view illustrating a magnetoresistance effect element of still another modification example of the invention.

In the embodiment, description has been given of a case where the cross-sectional shape of the insulating layer 5 and the first terminal T1, and the cross-sectional shape of the magnetic recording unit 3 have the same shape and the same size, and the central axis of the magnetic recording unit 3, and the central axis of the insulating layer 5 and the first terminal T1 are arranged to overlap each other (a case where the magnetic recording unit 3, the insulating layer 5, and the first terminal T1 have a flush structure in self-alignment), but the invention is not limited to this case. For example, as in a magnetoresistance effect element 1e illustrated in FIG. 5E, it is possible to employ a configuration in which the cross-sectional area of the insulating layer 55 and the first terminal T1d in the in-plane direction is set to be greater than the cross-sectional area of the magnetic recording unit 3 in the in-plane direction, an end position of one of the insulating layer 55 and the first terminal T1d is disposed at approximately the same position on a straight line as in an end position of the magnetic recording unit 3, and a formation position of the magnetic recording unit 3, and a formation position of the insulating layer 5 and the first terminal T1 deviate from each other. That is, it is possible to employ a structure in which the central axis of the magnetic recording unit 3 and the central axis of the insulating layer 55 and the first terminal T1d deviate from each other, and the magnetic recording unit 3, and the insulating layer 55 and the first terminal T1d do not have the flush structure in the self-alignment. In this manner, in the magnetoresistance effect element 1e, even though positional deviation of the central axis is present between the insulating layer 55 and the first terminal T1d, and the magnetic recording unit 3, since the insulating layer 55 covers the entirety of the bottom portion of the magnetic recording unit 3, a voltage can be applied to the entirety of the lower portion of the magnetic recording unit 3.

Figure 5F:
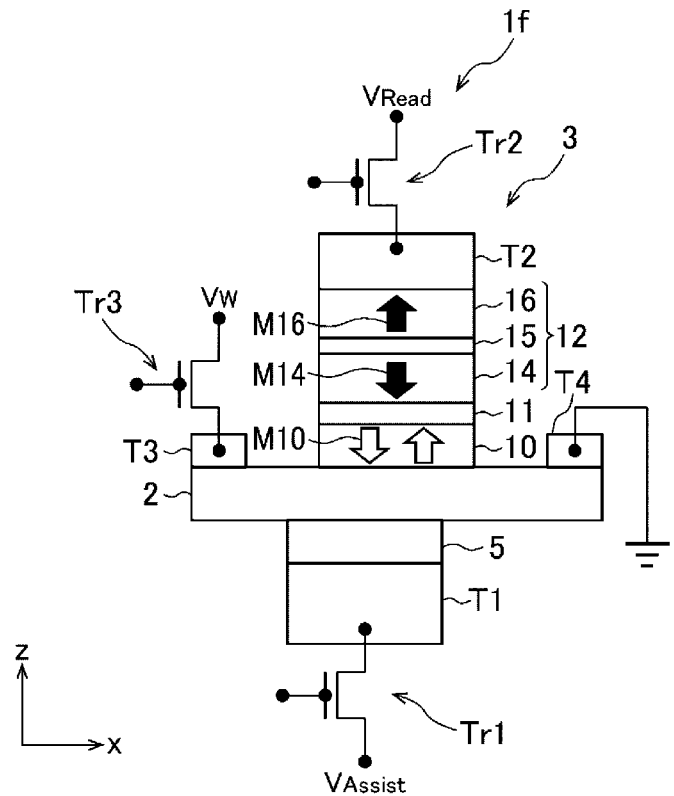
FIG. 5F is a schematic cross-sectional view illustrating a magnetoresistance effect element of still another modification example of the invention.

As in a magnetoresistance effect element if illustrated in FIG. 5F, it is possible to employ a configuration in which the cross-sectional shape of the insulating layer 5 and the first terminal T1, and the cross-sectional shape of the magnetic recording unit 3 are set to the same shape and the same size, and a position of the central axis of the magnetic recording unit 3, and a position of the central axis of the insulating layer 5 and the first terminal T1 deviate from each other. That is, both end positions of the insulating layer 5 and the first terminal T1, and both end positions of the magnetic recording unit 3 are not located on the same straight line, the insulating layer 5 does not cover the entirety of the bottom portion of the magnetic recording unit 3, and covers a partial region thereof. In this manner, even though the magnetic recording unit 3, and the insulating layer 55 and the first terminal T1d do not have the flush structure in the self-alignment, a voltage can be applied to the lower portion of the magnetic recording unit 3.

Figure 5G:
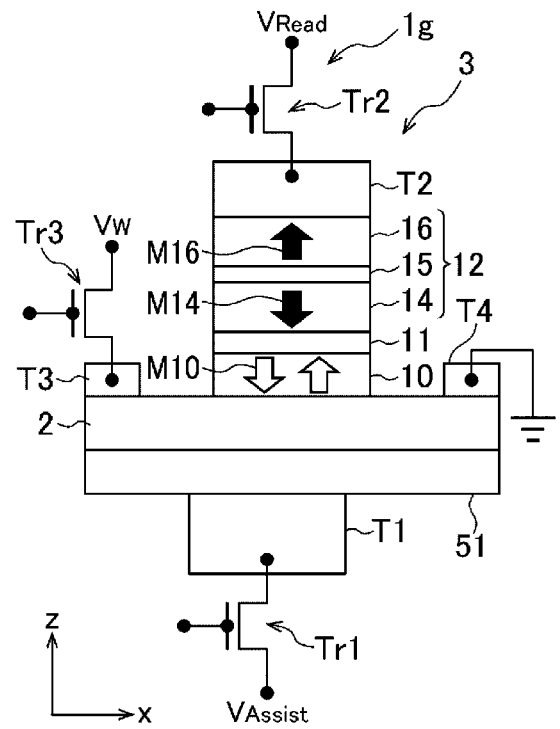
FIG. 5G is a schematic cross-sectional view illustrating a magnetoresistance effect element of still another modification example of the invention.
Figure 5H:
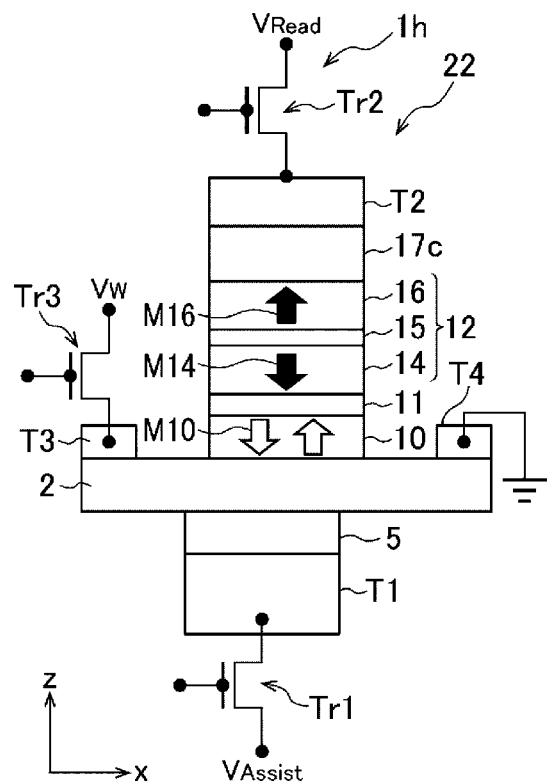
FIG. 5H is a schematic cross-sectional view illustrating a magnetoresistance effect element of still another modification example of the invention.
Figure 5I:
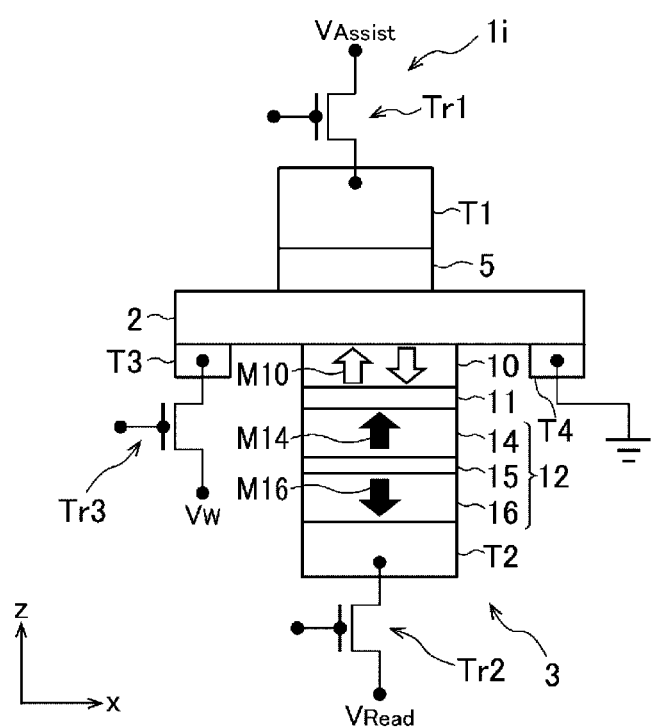
FIG. 5I is a schematic cross-sectional view illustrating a magnetoresistance effect element of still another modification example of the invention.

As in a magnetoresistance effect element 1g illustrated in FIG. 5G, the magnetic recording unit 3 and the first terminal T1 may not be flushed with each other in the self-alignment also in a case where a cross-sectional shape of an insulating layer 51 in the in-plane direction is the same shape as in the heavy metal layer 2, and the insulating layer 51 completely covers the rear surface of the heavy metal layer 2. In addition, a magnetic recording unit 22, and the insulating layer 5 and the first terminal T1 may not have the flush structure in the self-alignment also in a magnetoresistance effect element 1h including a diode 17c on the ferromagnetic layer 16 of the reference layer 12 as illustrated in FIG. 5H. In addition, also in a magnetoresistance effect element 1i having a configuration in which the magnetic recording unit 3 is disposed on the lower portion of the insulating layer 5 with the heavy metal layer 2 interposed therebetween as illustrated in FIG. 5I, the magnetic recording unit 3, and the insulating layer 5 and the first terminal T1 may not have the flush structure in the self-alignment.

In the embodiment, description has been given of a case where data is stored by associating the resistance value of the magnetic recording unit 3 in the anti-parallel state with data "1", and by associating the resistance value in the parallel state with "0", but the invention is not limited to this case. For example, data may be stored by associating the resistance value of the magnetic recording unit 3 in the anti-parallel state with data "0", and by associating the resistance value in the parallel state with "1".

In the embodiment, description has been given of a case where the first transistor Tr1 is turned on to apply a voltage to the heavy metal layer 2 through the insulating layer 5, and then, the third transistor Tr3 is turned on to cause the write current Iw to flow to the heavy metal layer 2, thereby reversing the magnetization direction of the recording layer 10 of the magnetic recording unit 3, but the invention is not limited to this case. For example, the first transistor Tr1 and the third transistor Tr3 may be simultaneously turned on, and voltage application to the heavy metal layer 2 and flowing of the write current Iw to the heavy metal layer 2 may be simultaneously performed. In addition, the magnetization direction of the recording layer 10 of the magnetic recording unit 3 may be reversed by turning on the third transistor Tr3 to cause the write current Iw to flow to the heavy metal layer 2, and then by turning on the first transistor Tr1 to apply a voltage to the heavy metal layer 2. In this manner, timing at which the first transistor Tr1 and the third transistor Tr3 are turned on is not particularly limited, but it is preferable that the third transistor Tr3 is turned on after the first transistor Tr1 is turned on from the viewpoint that write error rate (WER) can be reduced.

In the embodiment, description has been given of a case where the third transistor Tr3 is turned off to set the write current Iw to OFF, and then the first transistor Tr1 is turned off to set a voltage applied to the heavy metal layer 2 through the insulating layer 5 to OFF, but the invention is not limited to this case. For example, the first transistor Tr1 and the third transistor Tr3 may be simultaneously turned off to simultaneously set the write current Iw and the voltage application to the heavy metal layer 2 to OFF. In addition, after the first transistor Tr1 is turned off to set the voltage application to the heavy metal layer 2 to OFF, the third transistor Tr3 may be turned off to set the write current Iw to OFF. In this manner, timing at which the first transistor Tr1 and the third transistor Tr3 are turned off in writing is not particularly limited, but it is preferable that the first transistor Tr1 is turned off after the third transistor Tr3 is turned off from the viewpoint that the WER can be reduced.

In the embodiment, description has been given of a case where the second transistor Tr2 and the third transistor Tr3 are turned on to cause the read current Ir to flow from the third terminal T3 to the heavy metal layer 2, the magnetic recording unit 3, and the second terminal T2, but the invention is not limited to this case. The read current Ir may be caused to flow from the second terminal T2 to the magnetic recording unit 3, the heavy metal layer 2, and the fourth terminal T4 by turning on only the second transistor Tr2. In addition, the read voltage $V_{Read}$ may be set to be smaller than the ground voltage, and only the second transistor Tr2 may be turned on to cause the read current Ir to flow from the ground to the fourth terminal T4, the heavy metal layer 2, the magnetic recording unit 3, and the second terminal T2.

In the embodiment, description has been given of a case where the fourth terminal 14 is directly connected to the ground, but the invention is not limited to this case. For example, a drain of a fourth transistor may be connected to the fourth terminal T4, a source of the fourth transistor may be connected to a wiring to the ground, and the fourth terminal and the ground may be connected through the transistor.

(1-4) Operation and Effect

In the above-described configuration, the magnetoresistance effect element 1 includes the heave metal layer 2; the magnetic recording unit 3 including the recording layer 10 that includes a ferromagnetic layer that is magnetized in the vertical direction with respect to a film surface and is provided on the front surface of the heavy metal layer 2, the barrier layer 11 that is provided on a surface of the recording layer 10 which is opposite to the heavy metal layer 2 and is formed from an insulator, and the reference layer 12 which is provided on a surface of the barrier layer 11 which is opposite to the recording layer 10 and a magnetization of the reference layer is fixed in the vertical direction with respect to a film surface; the insulating layer 5 that is provided on a surface of the heavy metal layer 2 which is opposite to the magnetic recording unit 3; the first terminal T1 that is connected to the insulating layer 5 at a position facing the recording layer 10 with the heavy metal layer 2 and the insulating layer 5 interposed therebetween and applies a voltage to the heavy metal layer 2 through the insulating layer 5; the second terminal T2 that is connected to the reference layer 12; and the third terminal T3 and the fourth terminal 14 which are connected to the heavy metal layer 2, and cause the write current to flow to the heavy metal layer 2 between the magnetic recording unit 3 and the insulating layer 5.

Accordingly, since the magnetoresistance effect element 1 includes the insulating layer 5 of the heavy metal layer 2, and connection to the insulating layer 5 is established at a position facing the recording layer 10 with the heavy metal layer 2 and the insulating layer 5 interposed therebetween, the magnetization of the recording layer 10 can be reversed by applying a voltage to the heavy metal layer 2 through the insulating layer 5, and by causing the write current Iw to flow to the heavy metal layer 2, and the current does not flow to the magnetic recording unit 3 in writing. Accordingly, in the magnetoresistance effect element 1, it is possible to reduce the resistance of the MTJ of the magnetic recording unit 3 by reducing the thickness of the barrier layer 11, and it is possible to speed up a read operation.

In addition, in the magnetoresistance effect element 1, in writing, since the write assist voltage $V_{Assist}$ is applied to the heavy metal layer 2 through the insulating layer 5, even though a current is not caused to flow to the magnetic recording unit 3, data can be written. In reading, stored data can be read out only by causing the read current Ir to flow to the magnetic recording unit 3. The voltage control line can be changed between in writing and in reading, and it is possible to realize Read disturb free and Write disturb free.

Since spins performing the precession motion are injected to the recording layer 10, and the magnetization of the recording layer 10 magnetized in the vertical direction is reversed due to the spins performing the precession motion, the magnetization of the recording layer 10 can be reversed without applying an external magnetic field.

Figure 6:
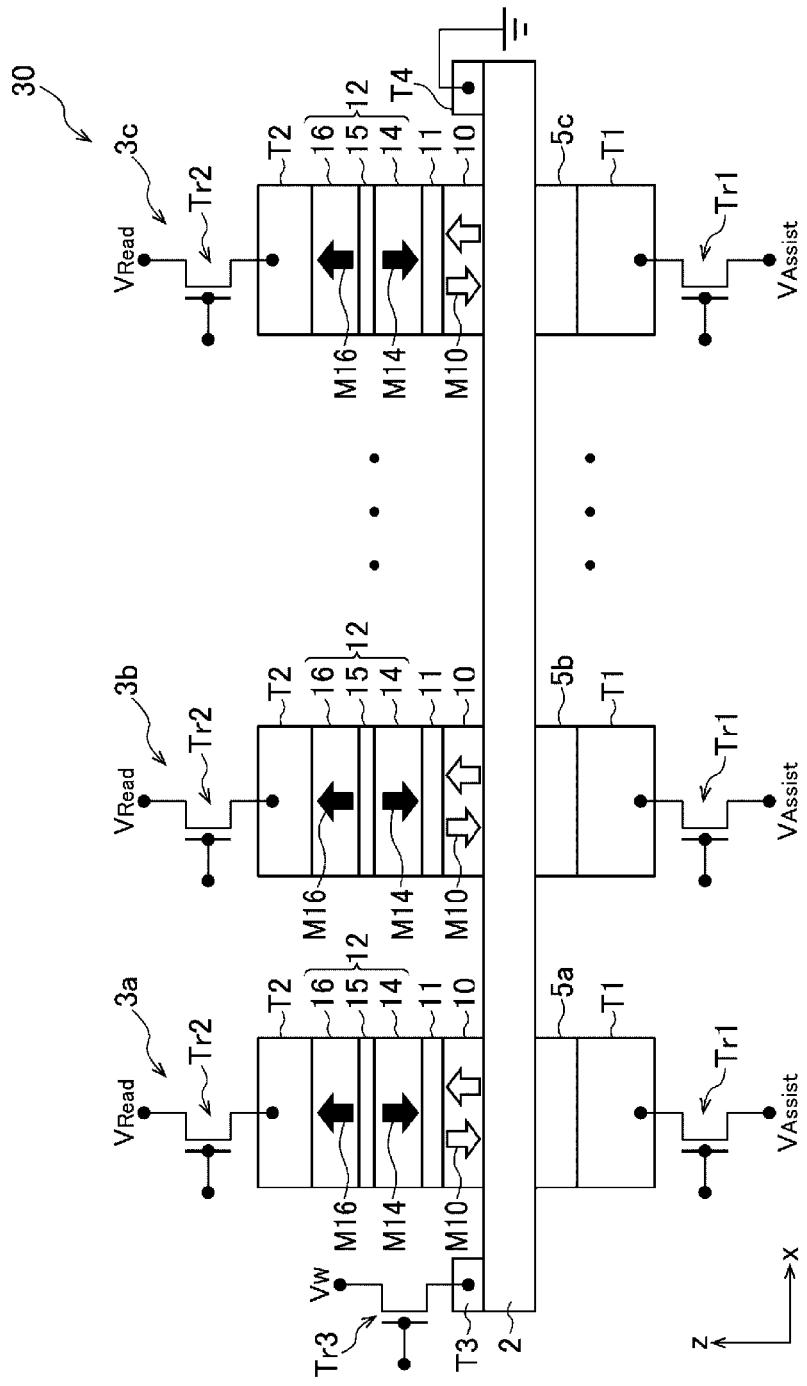
FIG. 6 is a schematic cross-sectional view illustrating a magnetic memory array of the embodiment of the invention.

(2) Magnetic Memory Array of Embodiment of Invention (2-1) Overall Configuration of Magnetic Memory Array As illustrated in FIG. 6, a magnetic memory array 30 of this embodiment includes a heavy metal layer 2 having an elongated shape extending in the first direction, a plurality of magnetic recording units 3, and a plurality of insulating layers 5. A configuration of the heavy metal layer 2, the magnetic recording units 3, and the insulating layers 5 are the same as in the magnetoresistance effect element 1 except that the length of the heavy metal layer 2 in the first direction is different, and thus description thereof will be omitted. In the magnetic memory array 30, the plurality of magnetic recording units 3 are arranged on a front surface of the heavy metal layer 2 having the elongated shape in the first direction of the heavy metal layer 2. In the magnetic memory array 30, the number of the magnetic recording units 3 provided can be appropriately set, and in conformity to the number, the size of the heavy metal layer 2 or the magnetic recording units 3, or the like is determined. In FIG. 6, three magnetic recording units 3a, 3b, and 3c are illustrated as a representative. In addition, in FIG. 6, different numeral numbers are given to the magnetic recording units 3a, 3b, and 3c, respectively, but this is for convenience in distinguishment of the respective magnetic recording units 3a, 3b, and 3c, and configurations thereof are the same as each other. That is, the magnetic memory array 30 includes a plurality of the magnetoresistance effect elements 1, the heavy metal layer 2 of one of the magnetoresistance effect elements 1 is extended in the first direction, the extended heavy metal layer 2 is shared by the other plurality of magnetoresistance effect elements 1, and the magnetic recording units 3 are arranged on the front surface of the heavy metal layer 2 in the first direction.

The insulating layer 5 is provided on a rear surface of the heavy metal layer which is a surface opposite to the front surface of the heavy metal layer 2 on which the magnetic recording unit 3 is provided in the same number as the number of the magnetic recording units 3, and are arranged on a lower portion of the magnetic recording units 3. In FIG. 6, a different reference numeral is given for every insulating layer like insulating layers 5a, 5b, and 5c to distinguish the plurality of insulating layers. The insulating layers 5a, 5b, and 5c are respectively arranged at positions facing the recording layers 10 of the magnetic recording units 3a, 3b, and 3c with the heavy metal layer 2 interposed therebetween, and substantially cover bottom surfaces (surfaces of the magnetic recording units 3a, 3b, and 3c which are in contact with the heavy metal layer 2) of the magnetic recording units 3a, 3b, and 3c.

As in the magnetoresistance effect element 1, terminals (a plurality of first terminals T1, a plurality of second terminals T2, a third terminal T3, and a fourth terminal T4) are connected to the magnetic memory array 30. Description of the same portion of the first terminals T1, the second terminals T2, the third terminal T3, and the fourth terminal T4 as in the first terminal T1, the second terminal T2, the third terminal T3, and the fourth terminal T4 of the magnetoresistance effect element 1 will be omitted.

The first terminals T1 are provided on a lower portion of the insulating layers 5a, 5b, and 5c one by one. The first terminals T1 are provided on rear surfaces of the insulating layers 5a, 5b, and 5c which are opposite to surfaces in contact with the heavy metal layer 2 to face the heavy metal layer 2 with the insulating layers 5a, 5b, and 5c interposed therebetween. The FET-type first transistor Tr1 is connected to each of the first terminals T1. In the first transistor Tr1 connected to the insulating layer 5a, a source is connected to a first write bit line (not illustrated). In the first transistor Tr1 connected to the insulating layer 5b, a source is connected to a second write bit line (not illustrated). In the first transistor Tr1 connected to the insulating layer 5c, a source is connected to a third write bit line (not illustrated). A voltage level of each of the write bit lines is set to $V_{Assist}$. When the first transistors Tr1 are turned on, a write assist voltage $V_{Assist}$ for reversing the magnetization M10 of the recording layer 10 of the magnetic recording unit 3 can be applied to the heavy metal layer 2 through the insulating layer 5.

The second terminals T2 are provided on reference layers 12 of the magnetic recording units 3a, 3b, and 3c in contact with reference layers 12 (ferromagnetic layers 16 thereof). In addition, the FET-type second transistor Tr2 is connected to each of the second terminals T2. In the second transistor Tr2 connected to the magnetic recording unit 3a, a source is connected to a first read bit line (not illustrated). In the second transistor Tr2 connected to the magnetic recording unit 3b, a source is connected to a second read bit line (not illustrated). In the second transistor Tr2 connected to the magnetic recording unit 3c, a source is connected to a third read bit line (not illustrated). A voltage level of each of the read bit lines is set to $V_{Read}$, and when the second transistors Tr2 are turned on, the read voltage $V_{Read}$ is applied to the second terminals T2.

The third terminal T3 and the fourth terminal T4 are provided on one end and on the other end of the heavy metal layer 2, and the plurality of magnetic recording units 3 are arranged between the both terminals. In this embodiment, the third terminal T3 is provided on a front surface of one end of the heavy metal layer 2 in the first direction, and the fourth terminal T4 is provided on a front surface of the other end of the heavy metal layer 2 in the first direction. The third terminal T3 is connected to the FET-type third transistor Tr3, and the fourth terminal T4 is connected to the ground. In the third transistor Tr3, a source is connected to a control line (not illustrated). A voltage level of the control line is set to $V_W$, and when the third transistor Tr3 is turned on, the write voltage $V_W$ is applied to the third terminal T3, and the write current Iw flows between the third terminal T3 and the fourth terminal T4 in the first direction.

When turning on the second transistor Tr2 connected to the magnetic recording unit 3a through the second terminal T2 and the third transistor Tr3, the read current Ir for reading a resistance value of the magnetic recording unit 3a flows through the magnetic recording unit 3a. In this embodiment, since $V_W$ is set to be higher than $V_{Read}$, the read current Ir can be caused to flow from the third terminal T3 to the second terminal T2 through the heavy metal layer 2 and the magnetic recording unit 3a. This is true of the magnetic recording unit 3b and 3c.

As described above, in this embodiment, the third terminal T3 and the fourth terminal T4 are provided on the front surface of the heavy metal layer 2, and contact from an upper side to the magnetic memory array 30 is made, but there is no limitation thereto. For example, the third terminal T3 and the fourth terminal T4 may be provided on the rear surface of the heavy metal layer 2, and contact from a lower side to the magnetic memory array 30 may be made.

(2-2) Write Method and Read Method for Magnetic Memory Array

Description will be given of a write method for the magnetic memory array 30 with reference to FIG. 7A and FIG. 7B in which the same reference numeral is given to the same configuration as in FIG. 6. Similarly, in the magnetic memory array 30, resistance of each of the magnetic recording units 3a, 3b, and 3c varies depending on whether the magnetization directions of the recording layer 10 and the reference layer 12 are parallel or anti-parallel. In the magnetic memory array 30, as in the magnetoresistance effect element 1, one-bit data of "0" and one-bit data of "1" are allocated to the parallel state and the anti-parallel state, respectively, by using a situation in which a resistance value of each of the magnetic recording units 3a, 3b, and 3c is different between the parallel state and the anti-parallel state, thereby storing data in the magnetoresistance effect element 1.

The write method for the magnetic memory array 30 will be described in more detail with reference to a case where the spin hall angle of the heavy metal layer 2 is positive. A relationship of a magnetization direction of the recording layer 10 of the magnetic recording unit 3a, 3b, or 3c, and a sign of the write assist voltage $V_{Assist}$ for reversing the magnetization of the recording layer 10 and a direction in which the write current Iw is caused to flow is the same as in the magnetoresistance effect element 1. In the magnetic memory array 30, it is assumed that in an initial state, the magnetic recording units 3a and 3b are storing data "0" in the parallel state with the magnetization direction of the recording layer 10 facing downward, and the magnetic recording unit 3c stores data "1" in the anti-parallel state with the magnetization direction of the recording layer 10 facing upward. In addition, it is assumed that all of the first transistors Tr1, the second transistors Tr2, and the third transistors Tr3 are turned off. In addition, in this example, it is assumed that data is written to the magnetic recording units 3a and 3c, and data is not written to the magnetic recording unit 3b.

Figure 7A:
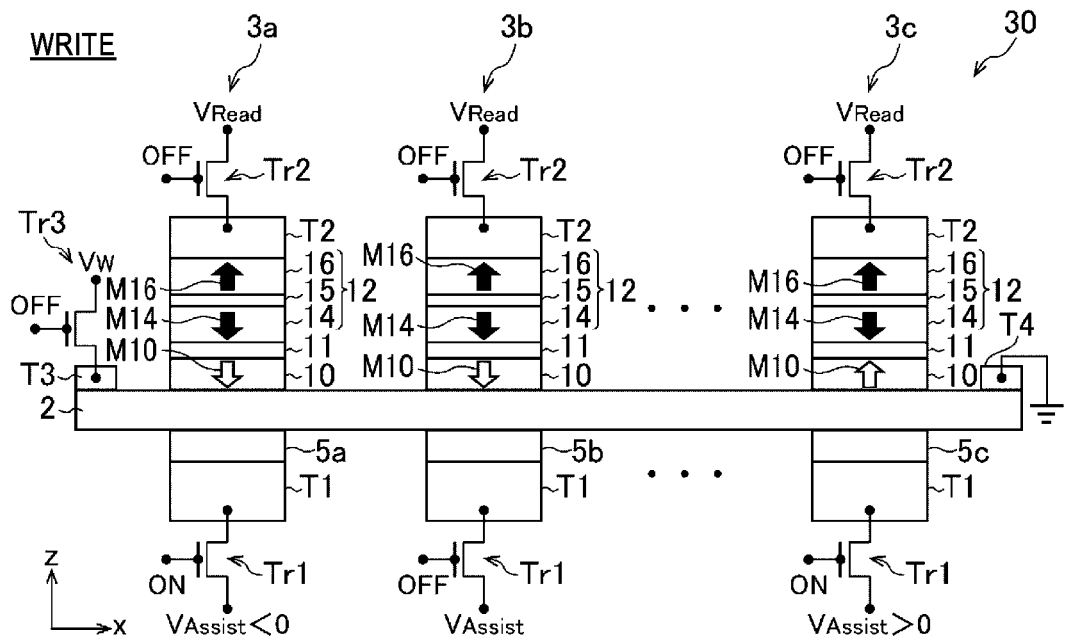
FIG. 7A is a schematic cross-sectional view describing a method for writing data to the magnetic memory array and illustrates a state in which a voltage is applied to the heavy metal layer through the insulating layer.

First, in the magnetic memory array 30, as illustrated in FIG. 7A, the first transistors Tr1 which are respectively connected to the insulating layers 5a and 5c are turned on, a negative write assist voltage $V_{Assist}$ is applied from the first terminal T1 to the heavy metal layer 2 through the insulating layer 5a, and a positive write assist voltage $V_{Assist}$ is applied from the first terminal T1 to the heavy metal layer 2 through the insulating layer 5c. As a result, an electric field in the +z-direction occurs in the heavy metal layer 2 on a lower side of the magnetic recording unit 3a, and an electric field in the −z-direction occurs in the heavy metal layer 2 on a lower side of the magnetic recording unit 3b.

Figure 7B:
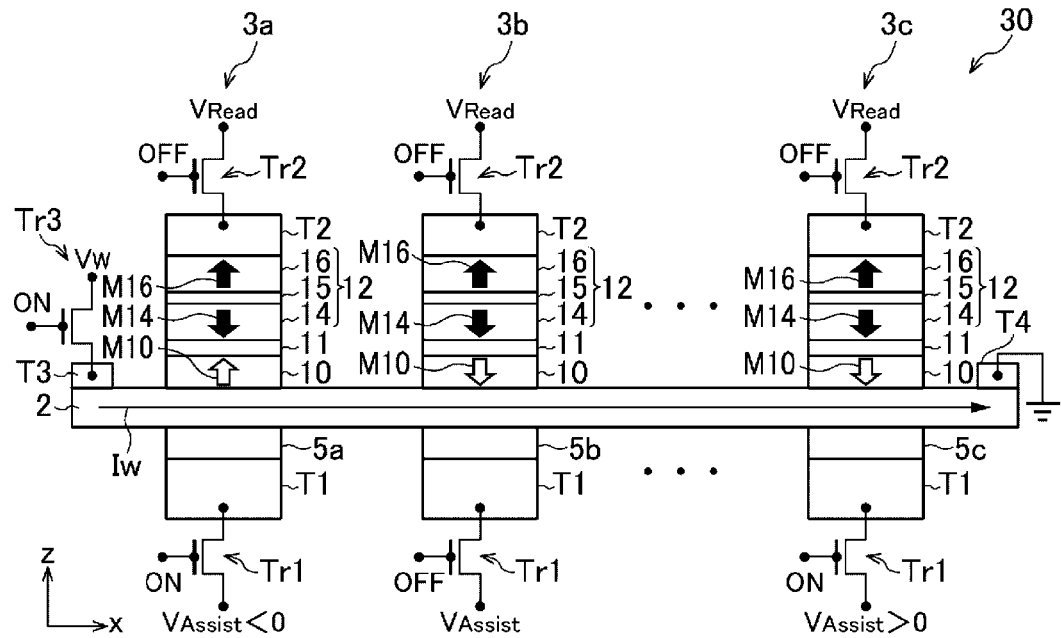
FIG. 7B is a schematic cross-sectional view illustrating a magnetoresistance effect element of still another modification example of the invention and illustrates a state in which data is written by causing a write current to flow.

Next, as illustrated in FIG. 7B (in FIG. 7B, a magnetization direction of the recording layer 10 after writing is illustrated), the first transistor Tr1 is retained to the ON state, the third transistor Tr3 is turned on, the write voltage $V_W$ is applied to the third terminal T3, and the write current Iw is caused to flow between the one end and the other end of the heavy metal layer 2. At this time, since the write voltage $V_W$ is set to be higher than the ground voltage, the write current Iw flows from the third terminal T3 to the fourth terminal 14 through the heavy metal layer 2, and the write current Iw flows from the one end of the heavy metal layer 2 to the other end in the +x-direction.

When the write current Iw flows to the heavy metal layer 2, a spin current (spin angular motion current) occurs in the heavy metal layer 2 due to a spin hall effect by a spin orbit interaction, and spins directed to a paper-surface front side (−y-direction in FIG. 1A) flow to the upper surface side (+z-direction) of the heavy metal layer 2, spins which are anti-parallel to the spins in a direction and are directed to a paper surface depth side (+y-direction in FIG. 1A) flow to the lower surface side (−z-direction) of the heavy metal layer 2, and the spins are unevenly distributed in the heavy metal layer 2.

At this time, since an electric field in the z-direction occurs in the heavy metal layer 2 on the lower side of the magnetic recording units 3a and 3c, spins which are unevenly distributed perform precessional motion due to a Rashba effect, and the spins having performed the precessional motion flow into the recording layer 10 of the magnetic recording units 3a and 3c due to the spin current flowing through the heavy metal layer 2. At this time, since the write current Iw flows through the magnetic recording unit 3a in the +x-direction, and the negative assist voltage $V_{Assist}$ is applied to the heavy metal layer 2 on the lower side of the magnetic recording unit 3a, a downward magnetization M10 is reversed to upward due to the spins which have performed the precessional motion and flowed into the recording layer 10. As a result, the magnetic recording unit 3a enters the anti-parallel state, and data "1" is stored. In addition, since the write current Iw flows through the magnetic recording unit 3c in the +x-direction, and a positive assist voltage $V_{Assist}$ is applied to the heavy metal layer 2 on the lower side of the magnetic recording unit 3c, an upward magnetization M10 is reversed to downward due to the spins which have performed the precessional motion and flowed into the recording layer 10. As a result, the magnetic recording unit 3c enters the parallel state, and data "0" is stored.

On the other hand, since the assist voltage is not applied to the magnetic recording unit 3b, even when spins which are unevenly distributed due to flowing of the write current Iw in the +x-direction flow into the recording layer 10 due to the spin current, magnetization reversal does not occur. As a result, the magnetic recording unit 3b is retained to the parallel state, and stores data "0". As described above, the first transistor Tr1 has a function as a bit selection transistor that selects a write bit (the magnetic recording units 3a and 3c).

After data writing, each of the first transistors Tr1 is turned off after the third transistor Tr3 is turned off. That is, application of the write voltage $V_W$ is stopped after the write current Iw is set to OFF.

As described above, in the magnetic memory array 30, the magnetization direction of the recording layer 10 of the magnetic recording units 3a and 3c which are selected is reversed by causing the write current Iw to flow to the heavy metal layer 2 while applying a voltage to the heavy metal layer 2 through the insulating layers 5a and 5c which are selected, and thus data "0" or "1" data can be collectively written, and the magnetic recording unit 3b that is not selected can retain data. In addition, in the write operation, each of the second transistors Tr2 is always turned off, and thus a current does not flow to the magnetic recording unit 3 in data writing differently from the magnetoresistance effect element in the related art. According to this, in the magnetic memory array 30, a resistance value of the magnetic recording unit 3 can be made small by reducing the thickness of the barrier layer 11 of each of the magnetic recording units 3a, 3b, and 3c, time necessary for the write operation can be shortened, and high speed of the magnetoresistance effect element 1 can be realized.

Figure 8:
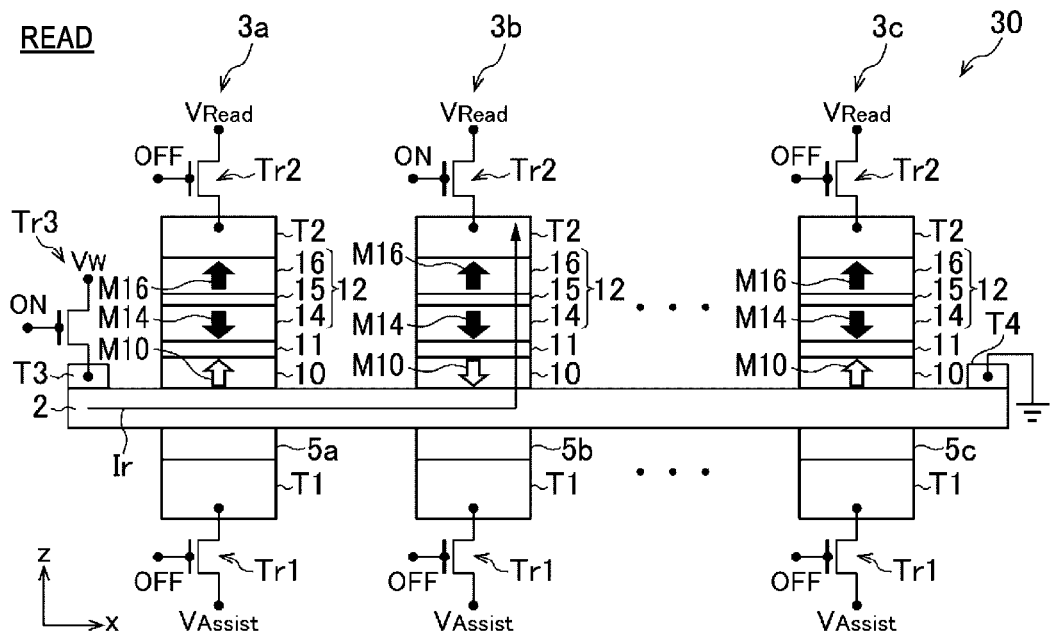
FIG. 8 is a schematic cross-sectional view describing a method for reading data from the magnetic memory array.

Next, description will be given of a data read method for the magnetic memory array 30 with reference to FIG. 8. It is assumed that in an initial state, all transistors are turned off, and data stored in the magnetic recording unit 3b is read. The third transistor Tr3 is turned on to apply the write voltage $V_W$ to the third terminal T3, and the second transistor Tr2 connected to the magnetic recording unit 3b is turned on to apply the read voltage $V_{Read}$ to the second terminal T2 connected to the magnetic recording unit 3b. At this time, since the read voltage $V_{Read}$ is set to be lower than the write voltage $V_W$, the read current Ir flows from the third terminal T3 to the heavy metal layer 2, the magnetic recording unit 3b, and the second terminal T2 in this order. The magnitude of the read current Ir varies depending on the resistance value of the magnetic recording unit 3b, and thus a situation as to whether the magnetic recording unit 3b is in the parallel state or the anti-parallel state, that is, whether the magnetic recording unit 3 is storing data "0" or data "1" can be read out from the magnitude of the read current Ir.

Then, after the second transistor Tr2 is turned off, the third transistor Tr3 is turned off. Since the third transistor Tr3 is turned off after the second transistor Tr2, that is, since the write voltage $V_W$ is set to OFF after the read voltage $V_{Read}$, it is possible to suppress a current from flowing from the second terminal to the third terminal through the magnetic recording unit 3b and the heavy metal layer 2, and thus the barrier layer 11 can be protected, and the barrier layer 11 can be made thinner. In addition to this, it is also possible to suppress Read disturb in which the magnetization state of the recording layer 10 varies due to a current flowing through the magnetic recording unit 3b.

In this manner, in the magnetic memory array 30, since the write assist voltage $V_{Assist}$ is applied to the first terminal T1 in writing, the read voltage $V_{Read}$ is applied to the second terminal T2 in reading, and a voltage control line in writing and a voltage control line in reading are different from each other, it is possible to realize Read disturb free and Write disturb free.

Figure 9A:
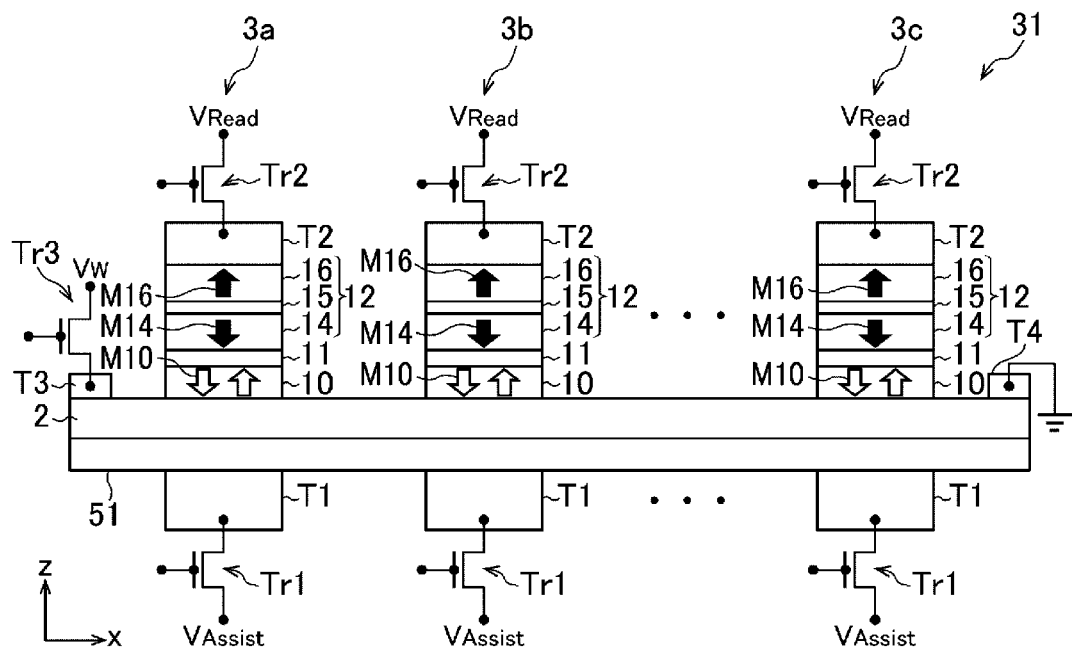
FIG. 9A is a schematic cross-sectional view illustrating a magnetic memory array of a modification example of the invention.

(2-3) Modification Example of Magnetic Memory Array of Embodiment of Invention In the embodiment, description has been given of a case where the magnetic memory array 30 includes a plurality of insulating layers 5a, 5b, and 5c which are respectively arranged on a lower side of the magnetic recording units 3a, 3b, and 3c, but the invention is not limited to this case. For example, as in an insulating layer 51 of a magnetic memory array 31 illustrated in FIG. 9A, a cross-sectional shape of the insulating layer 51 in an in-plane direction may be set to the same shape as in the heavy metal layer 2, and the insulating layer 51 may cover the entirety of a rear surface of the heavy metal layer 2. In this case, the insulating layer 51 and the heavy metal layer 2 can be continuously stacked, and a process of shaping the insulating layer to, for example, a circular column shape or the like can be omitted, and thus the magnetic memory array can be manufactured in an easier manner.

The shape of the insulating layers 5a, 5b, and 5c is not particularly limited as long as the insulating layers 5a, 5b, and 5c can substantially cover bottom surfaces of the magnetic recording units 3a, 3b, and 3c from the rear surface side of the heavy metal layer 2, and may be various shapes such as a triangular shape, a quadrangular shape, a polygonal shape of a quadrangle or greater, and an elliptical shape.

Figure 9B:
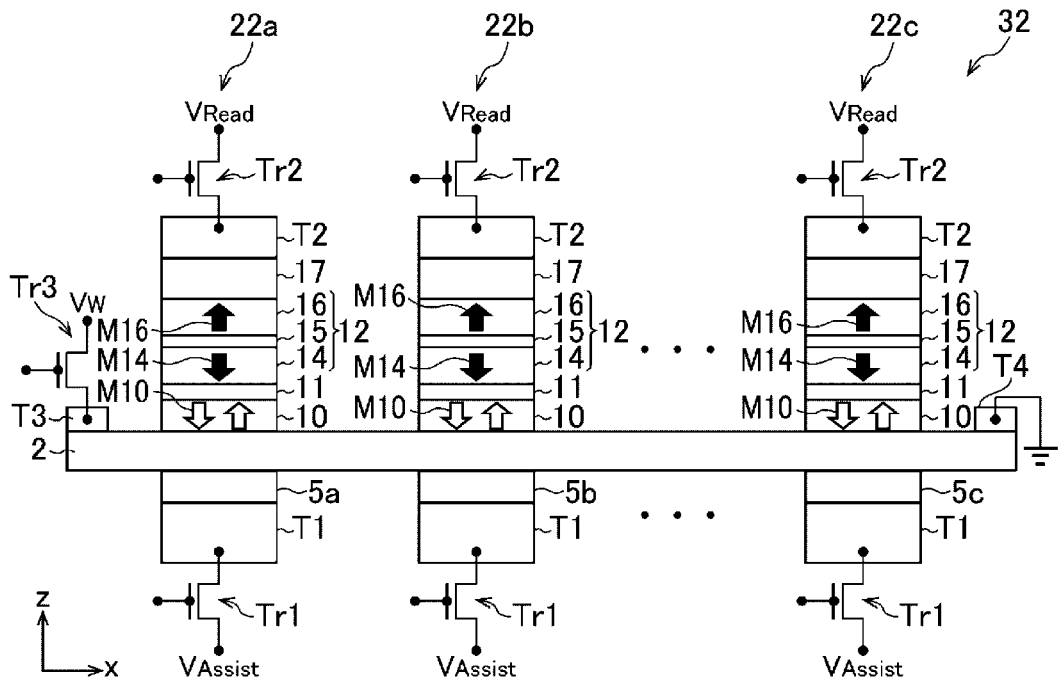
FIG. 9B is a schematic cross-sectional view illustrating a magnetic memory array of another modification example of the invention.

As in a magnetic memory array 32 illustrated in FIG. 9B, a diode 17 may be provided on the ferromagnetic layer 16 of the reference layer 12. In the diode 17, an anode side is in contact with the ferromagnetic layer 16, and a cathode side is in contact with the second terminal T2, and thus a current is suppressed from flowing from the second terminal T2 to the heavy metal layer 2. In this case, in the read operation, since the read voltage $V_{Read}$ is higher than the ground voltage, a current is suppressed from flowing from the second terminal T2 to the fourth terminal T4 through the magnetic recording unit and the heavy metal layer 2, and thus the thickness of the barrier layer 11 can be made smaller. In addition, a cross point type magnetic memory device to be described later is realized.

In the embodiment, description has been given of a case where the insulating layers 5a, 5b, and 5c and the first terminal T1, and the magnetic recording units 3a, 3b, and 3c have the same shape in a cross-sectional shape in an in-plane direction, and the magnetic recording units 3a, 3b, and 3c, and the insulating layers 5a, 5b, and 5c are arranged to overlap each other, respectively (a case where the magnetic recording units 3a, 3b, and 3c, and the insulating layers 5a, 5b, and 5c and the first terminal T1 have a flush structure in self-alignment), but the invention is not limited to this case. As described above in FIG. 5D, in the magnetoresistance effect element, it is preferable that a cross-sectional area of each of the insulating layers 5a, 5b, and 5c, and the first terminal T1 in the in-plane direction is set to be greater than a cross-sectional area of each of the magnetic recording units 3a, 3b, and 3c in the in-plane direction, and a voltage is applied to the entirety of lower portions of the magnetic recording units 3a, 3b, and 3c, but the cross-sectional area of each of the insulating layers 5a, 5b, and 5c, and the first terminal T1 in the in-plane direction may be set to be smaller than the cross-sectional area of each of the magnetic recording units 3a, 3b, and 3c in the in-plane direction.

Figure 9C:
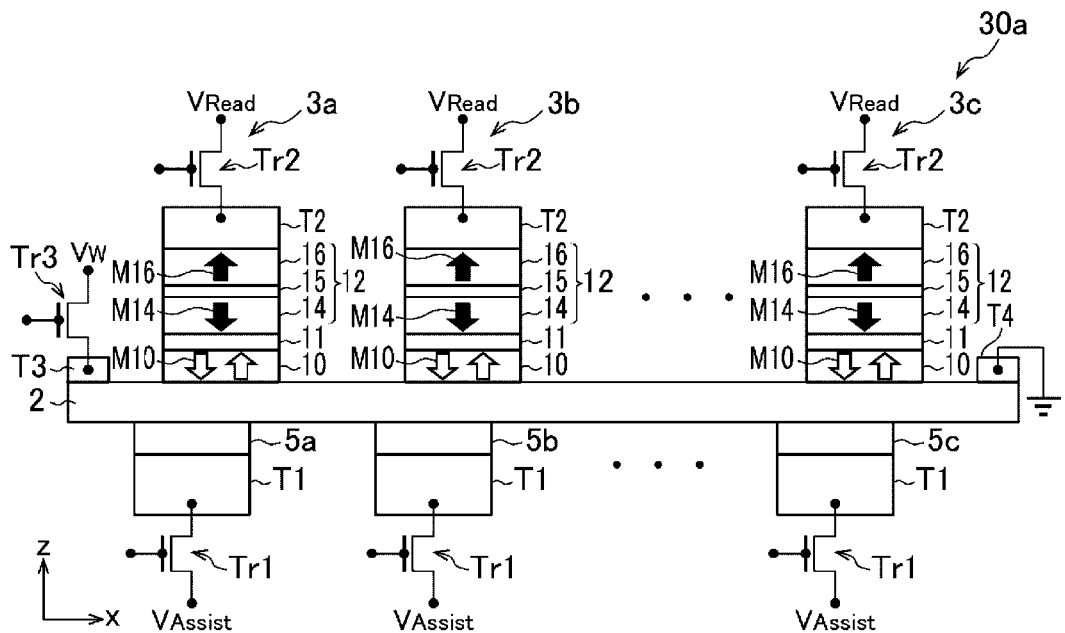
FIG. 9C is a schematic cross-sectional view illustrating a magnetic memory array of another modification example of the invention.

In a case where the insulating layers 5a, 5b, and 5c, and the first terminal T1, and the magnetic recording units 3a, 3b, and 3c are formed in the same shape and size in the cross-section, for example, as in a magnetic memory array 30a illustrated in FIG. 9C, positions of the magnetic recording units 3a, 3b, and 3c, and the insulating layers 5a, 5b, and 5c may deviate from each other, and the magnetic recording units 3a, 3b, and 3c, and the insulating layers 5a, 5b, and 5c and the first terminal T1 may not have the flush structure in the self-alignment.

Figure 9D:
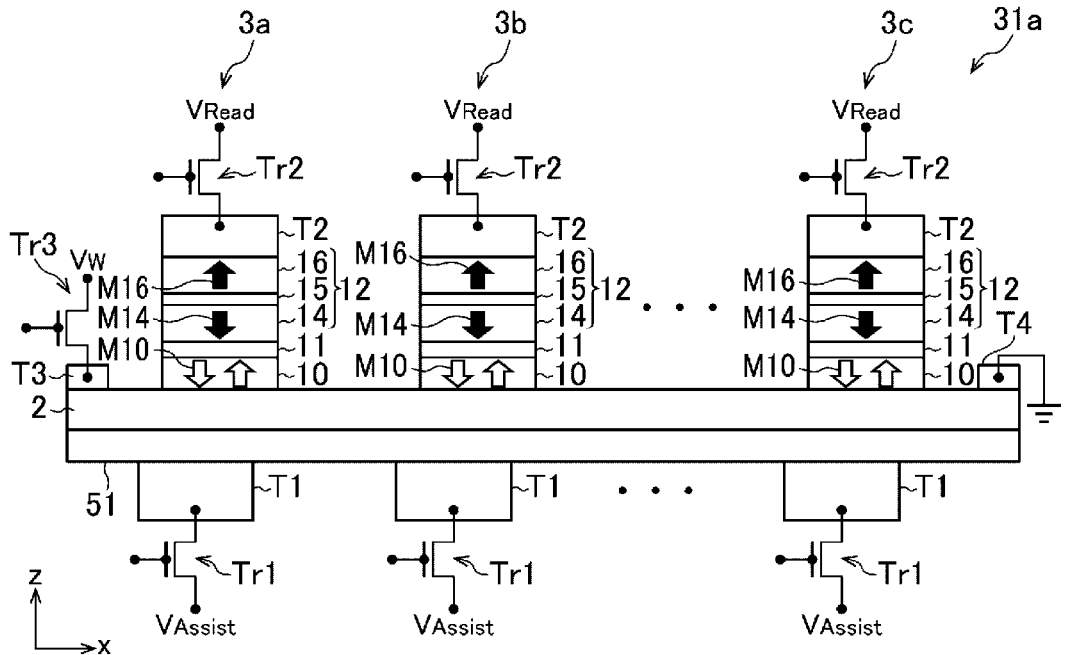
FIG. 9D is a schematic cross-sectional view illustrating a magnetic memory array of still another modification example of the invention.
Figure 9E:
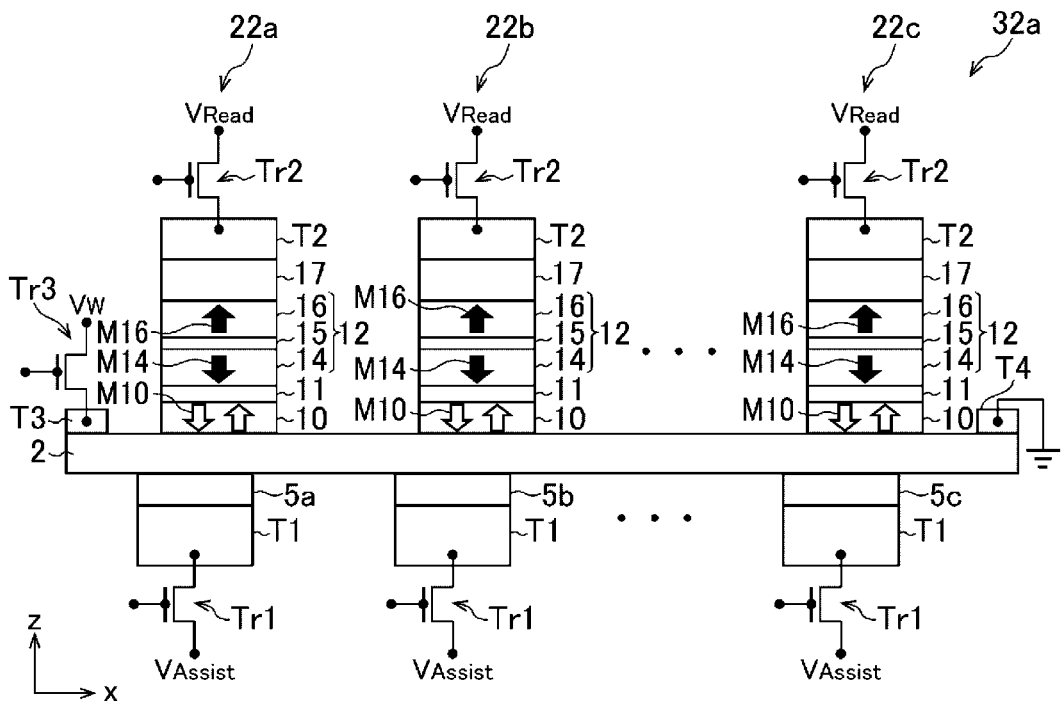
FIG. 9E is a schematic cross-sectional view illustrating a magnetic memory array of still another modification example of the invention.

Description has been given of the magnetic memory array 31 in which the cross-sectional shape of the insulating layer 51 in the in-plane direction is the same as in the heavy metal layer 2, the insulating layer 51 completely covers the rear surface of the heavy metal layer 2, and the magnetic recording units 3a, 3b, and 3c, and the first terminal T1 are arranged to overlap each other. However, the invention is not limited thereto, and the cross-sectional area of the first terminal T1 in the in-plane direction may be set to be greater or smaller than the cross-sectional area of each of the magnetic recording units 3a, 3b, and 3c in the in-plane direction, and as in a magnetic memory array 31a illustrated in FIG. 9D, the magnetic recording units 3a, 3b, and 3c, and the first terminal T1 may not have the flush structure in the self-alignment. In addition, with respect to a magnetic memory array 32a including a diode 17 on the ferromagnetic layer 16 of the reference layer 12 as illustrated in FIG. 9E, similarly, the magnetic recording units 3a, 3b, and 3c, and the insulating layers 5a, 5b, and 5c and the first terminal T1 may not have the flush structure in the self-alignment. Note that, even in this case, the cross-sectional area of each of the insulating layers 5a, 5b, and 5c, and the first terminal T1 in the in-plane direction may be set to be greater or smaller than the cross-sectional area of each of the magnetic recording units 3a, 3b, and 3c in the in-plane direction.

Figure 10A:
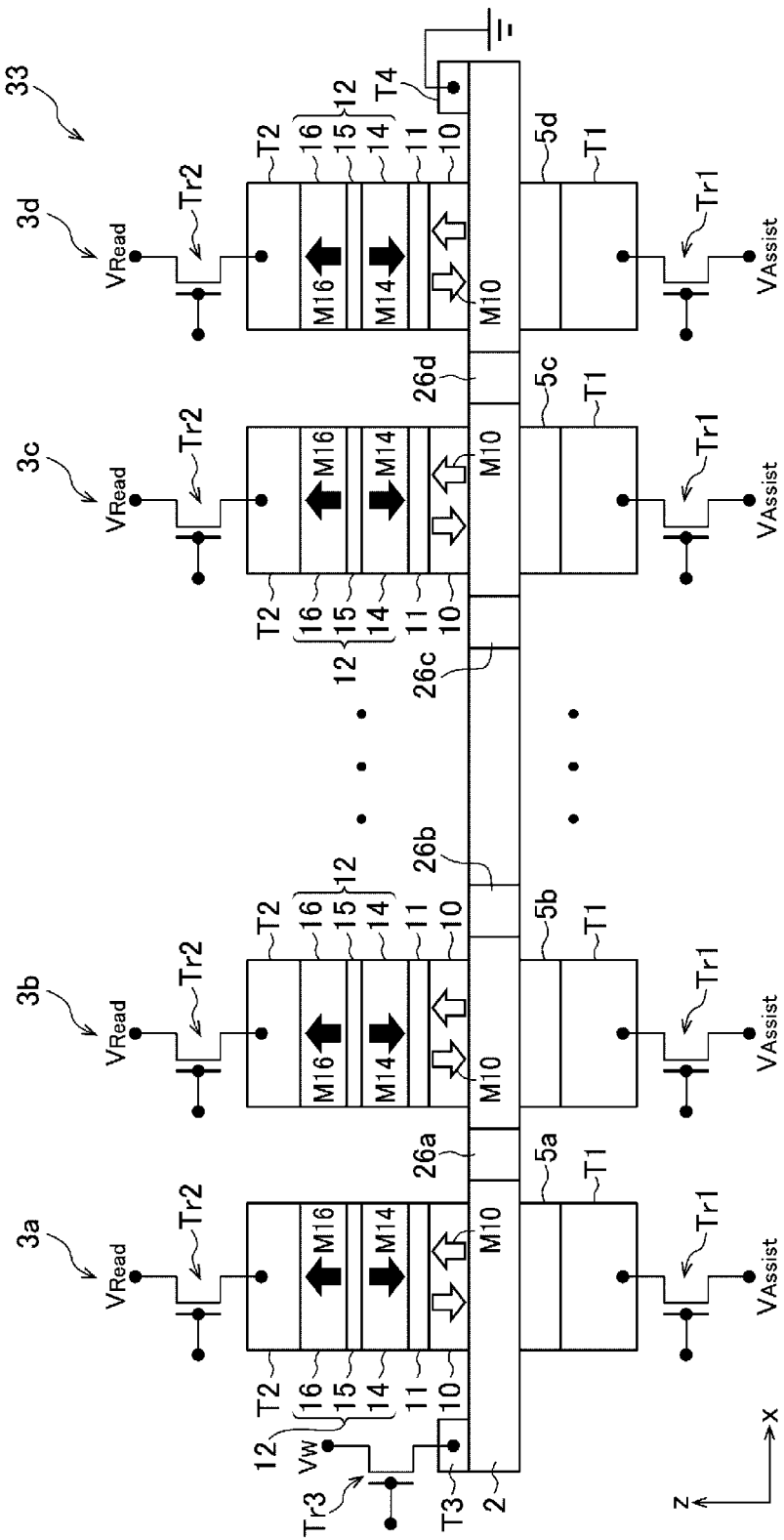
FIG. 10A is a schematic cross-sectional view illustrating a magnetic memory array of still another modification example of the invention.
Figure 10B:
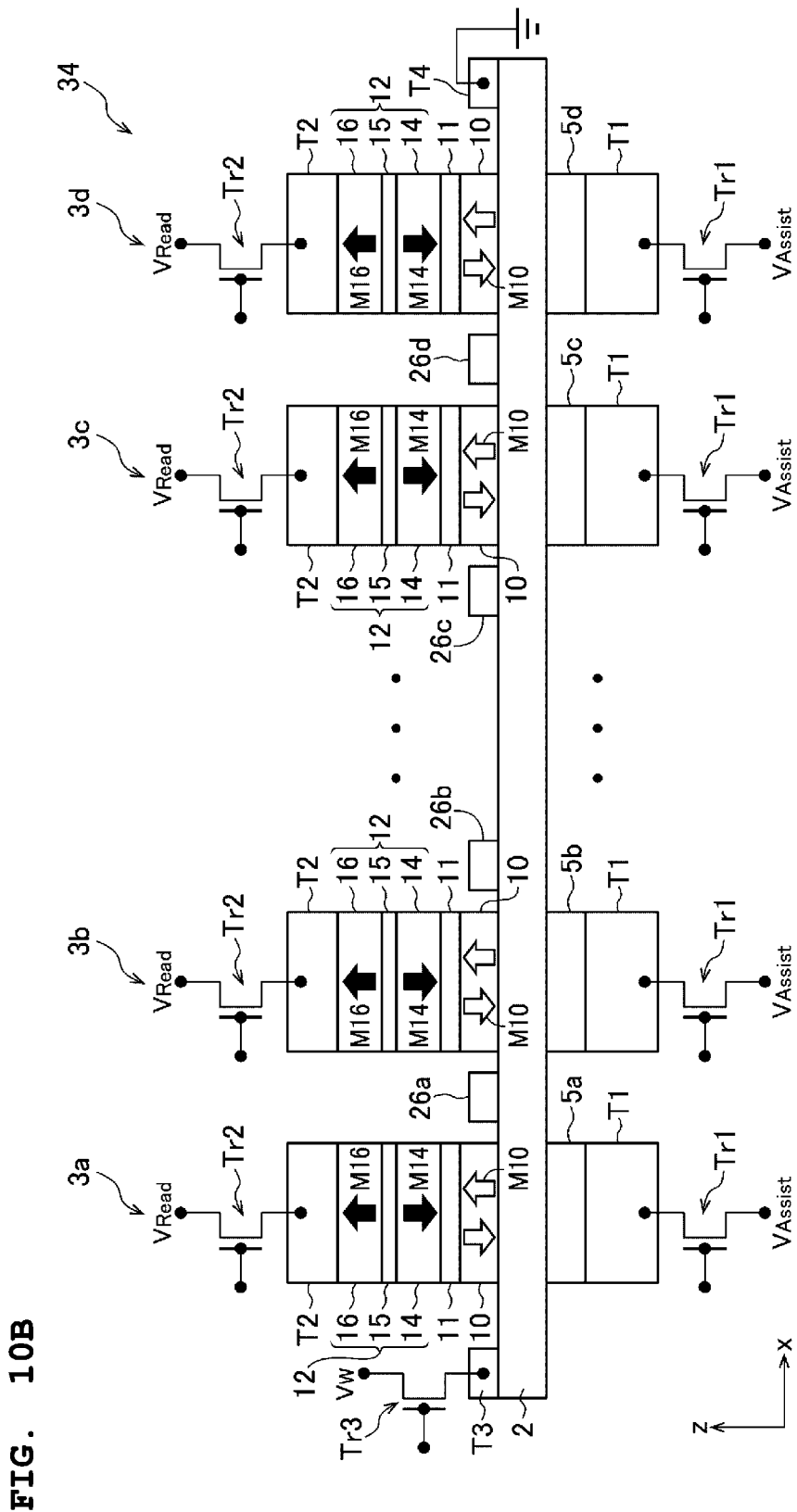
FIG. 10B is a schematic cross-sectional view illustrating a magnetic memory array of still another modification example of the invention.

In the magnetic memory array 30, a conductive layer formed from a metal with high conductivity may be inserted into the heavy metal layer 2 between adjacent magnetic recording units 3. For example, as in a magnetic memory array 33 illustrated in FIG. 10A, a conductive layer 26a is disposed in the heavy metal layer 2 between the magnetic recording unit 3a and the magnetic recording unit 3b, a conductive layer 26b is provided in the heavy metal layer 2 in adjacent to the magnetic recording unit 3b, a conductive layer 26c is provided in the heavy metal layer 2 in adjacent to the magnetic recording unit 3c, and a conductive layer 26d is provided in the heavy metal layer 2 between the magnetic recording unit 3c and the magnetic recording unit 3d. In this manner, the magnetic memory array 33 has a configuration in which a plurality of the magnetoresistance effect elements 1 are connected in series through the conductive layers 26. In this case, in the magnetic memory array 33, the resistance of the heavy metal layer 2 can be reduced, and thus an adverse effect of voltage drop in the heavy metal layer 2 can be suppressed, and energy consumption can be further reduced. Note that, as in a magnetic memory array 34 illustrated in FIG. 10B, even in a case where conductive layers 26a, 26b, 26c, and 26d are arranged on the heavy metal layer 2 between the magnetic recording units 3a, 3b, 3c, and 3d adjacent to each other, the same effect can be obtained. It is preferable that the conductive layer 26 is formed from, for example, Ta, W, Cu, Al, Ti, or an alloy containing at least one or more of these elements.

In the magnetic memory array 30, two magnetic recording units adjacent to each other may be set as a pair, a terminal may be provided on a heavy metal layer between the two magnetic recording units, and data stored in a bit may be read out by using the terminal. For example, in a magnetic memory array 35 illustrated in FIG. 10C, a first terminal T5 is provided between the magnetic recording units 3a and 3b adjacent to each other, and the magnetic recording units 3c and 3d adjacent to each other. In addition, each bit performs storage so that in a state in which one magnetic recording unit is in an anti-parallel state, and the other magnetic recording unit is in a parallel state.

In the magnetic memory array 35, for example, the read current Ir is caused to flow from the reference layer 12 of the magnetic recording unit 3b to the reference layer 12 of the magnetic recording unit 3a through the heavy metal layer 2, an intermediate potential between the magnetic recording unit 3b and the magnetic recording unit 3a is measured with the fifth terminal T5, and stored data can be read out on the basis of the measured intermediate potential. The read current Ir can flow from the reference layer 12 of the magnetic recording unit 3b to the reference layer 12 of the magnetic recording unit 3a through the heavy metal layer 2 by setting the read voltage $V_{Read}$ applied to the magnetic recording unit 3a to be smaller than the read voltage $V_{Read}$ applied to the magnetic recording unit 3b, and by turning on only the second transistor Tr2 connected to the magnetic recording units 3a and 3b.

Stored data can also be read out by applying a predetermined voltage to the second terminal T2 of the magnetic recording unit 3b, by setting the second terminal of the magnetic recording unit 3a to the ground level, by applying the read voltage $V_{Read}$ to the fifth terminal T5, and by detecting the read current Ir that flows into the fifth terminal T5. In addition, the second terminal T2 of the magnetic recording unit 3a and the second terminal of the magnetic recording unit 3b may be connected to a differential amplifier, and stored data can also be read out on the basis of a voltage that is output in correspondence with a difference in a resistance value between the magnetic recording units 3a and 3b.

As described above, when the two magnetic recording units are set to read out data stored as a pair, data can be read out at a higher speed in comparison to a case where stored data is sequentially read out for every magnetic recording unit. In a case where the magnetic memory array includes a larger number of magnetic recording units, data read time can be further shortened.

(2-4) Operation and Effect

In the above-described configuration, the magnetic memory array 30 includes a plurality of the magnetoresistance effect elements 1, the heavy metal layer 2 of one of the magnetoresistance effect elements 1 extends in the first direction, the extended heavy metal layer 2 is shared by the other plurality of magnetoresistance effect elements 1, and the magnetic recording units 3a, 3b, and 3c are arranged in the first direction on the heavy metal layer 2.

Accordingly, since the magnetic memory array 30 includes the plurality of magnetoresistance effect elements 1, the magnetization of the recording layer 10 of the magnetic recording units 3a, 3b, and 3c can be reversed by applying a voltage to the heavy metal layer 2 through the insulating layers 5a, 5b, and 5c, and by causing the write current Iw to flow to the heavy metal layer 2, and a current does not flow to the magnetic recording units 3a, 3b, and 3c in writing. According to this, in the magnetic memory array 30, it is possible to reduce the resistance of the MTJ of the magnetic recording units 3a, 3b, and 3c by reducing the thickness of the barrier layer 11, and it is possible to speed up a read operation.

In addition, in the magnetoresistance effect element 1, in writing, since the write assist voltage $V_{Assist}$ is applied to the heavy metal layer 2 through the insulating layers 5a, 5b, and 5c, even though a current is not caused to flow to the magnetic recording units 3a, 3b, and 3c, data can be written. In reading, stored data can be read out only by causing the read current Ir to flow to the magnetic recording units 3a, 3b, and 3c. The voltage control line can be changed between in writing and in reading, and it is possible to realize Read disturb free and Write disturb free.

(3) Magnetic Memory Device Using Magnetic Memory Array of this Embodiment

Figure 11:
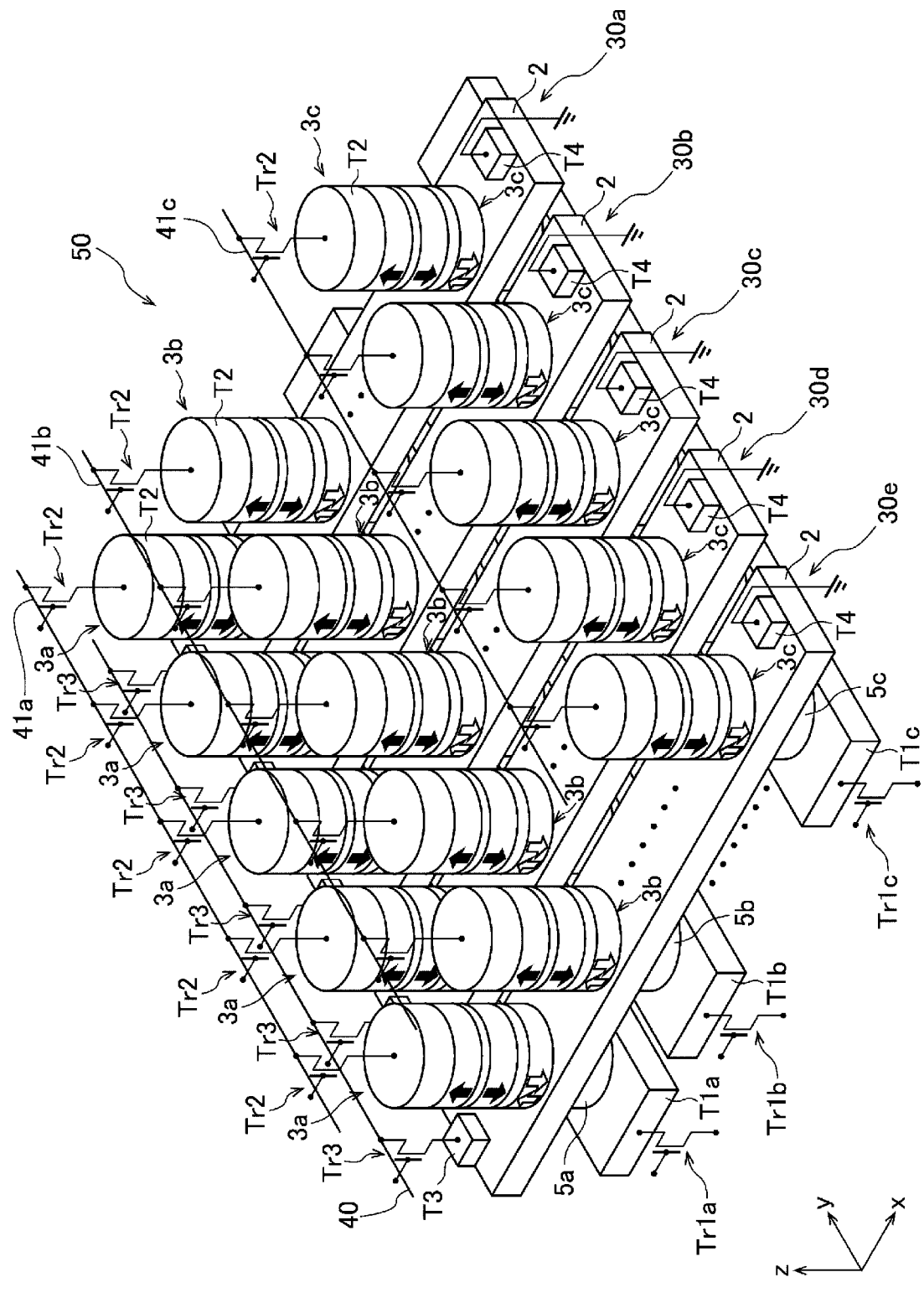
FIG. 11 is a perspective view illustrating a magnetic memory device of the embodiment of the invention.

A magnetic memory device can be configured by a plurality of the magnetic memory arrays 30 of this embodiment in a direction (y-direction) orthogonal to the first direction. An example of the magnetic memory device will be described with reference to FIG. 11 in which the same reference numeral is given to the same configuration as in FIG. 6. For convenience of explanation, arrangement of the magnetic recording units on the heavy metal layer 2 (x-direction) is referred to as a row, and arrangement of the magnetic recording units in a direction (y-direction) orthogonal to the heavy metal layer 2 is referred to as a column.

In a magnetic memory device 50, a plurality of magnetic memory arrays 30a, 30b, 30c, 30d, and 30e are arranged in the y-direction, and the magnetic recording units 3a, 3b, and 3c of the magnetic memory arrays 30a, 30b, 30c, 30d, and 30e are arranged in the y-direction, respectively. In this embodiment, a plurality of the magnetic recording units 3a, a plurality of the magnetic recording units 3b, and a plurality of the magnetic recording units 3c are arranged in the same column, respectively. In this embodiment, five pieces of the magnetic memory arrays 30a, 30b, 30c, 30d, and 30e are arranged, but the number of the magnetic memory arrays arranged is not limited. In addition, when the magnetic recording units are arranged in the y-direction, it is not necessary for the magnetic recording units 3a to be arranged in the same column, and the magnetic recording unit 3a and the magnetic recording unit 3b may be arranged in the same column.

In the magnetic memory device 50, first elongated terminals T1a, T1b, and T1c are formed in a film shape extending in a direction (y-direction) orthogonal to the first direction. In the magnetic memory device 50, the first elongated terminals T1a, T1b, and T1c are provided one by one at positions facing the plurality of arranged magnetic recording units 3a (3b or 3c) with the heavy metal layer 2a and the insulating layer 5a (5b or 5c) interposed therebetween for every column of the magnetic recording units 3a, 3b, and 3c, and are respectively shared by the magnetic recording units 3a, 3b, or 3c which are arranged in the same column. Drains of first transistors Tr1a, Tr1b, and Tr1c are respectively connected to the first elongated terminals T1a, T1b, and T1c, which are provided, at one end in the extending direction, and the first transistors Tr1 which are respectively connected to the first terminals T1 are grouped into one for every column.

As described above, in the magnetic memory device 50, since the first elongated terminal T1a, T1b, or T1c to be shared is provided for every column, it is possible to reduce the number of the first transistors to one for every column, and space saving is realized, and thus a high-density memory can be realized.

Sources and gates of the first transistors Tr1a, Tr1b, and Tr1c are connected to a control device (not illustrated), and when the control device applies a voltage to the gate to turn on the first transistors Tr1a, Tr1b, and Tr1c, the write assist voltage $V_{Assist}$ is applied from the control device to the first elongated terminals T1a, T1b, and T1c. Accordingly, for example, when the first transistor Tr1a is turned on, the write assist voltage $V_{Assist}$ is applied to the heavy metal layer 2 on a lower side of the magnetic recording unit 3a of the magnetic memory arrays 30a, 30b, 30c, 30d, and 30e through the insulating layer 5.

The second transistors Tr2 connected to the magnetic recording units 3a, 3b, or 3c are connected to the same read word line for every column of the magnetic recording units. In this embodiment, the second transistors Tr2 respectively connected to the magnetic recording units 3a of the magnetic memory arrays 30a, 30b, 30c, 30d, and 30e are connected to a first read word line 41a, the second transistors Tr2 respectively connected to the magnetic recording units 3b are connected to a second read word line 41b, and the second transistors Tr2 respectively connected to the magnetic recording units 3c are connected to a third read word line 41c. The first read word line 41a, the second read word line 41b, and the third read word line 41c are connected to a control unit (not illustrated), and a voltage level is set to the read voltage $V_{Read}$.

Next, a write method for the magnetic memory device 50 will be described. A relationship of a magnetization direction of the recording layer of the magnetic recording units 3a, 3b, and 3c, and a direction of the write current Iw for reversing the magnetization direction of the recording layer, and a sign of the write assist voltage $V_{Assist}$ is the same as in the magnetic memory array 30, and thus description thereof will be omitted here. Here, description will be given with reference to a case where data is written to the magnetic recording unit 3b of the magnetic memory array 30a. It is assumed that all transistors are turned off after a write operation and a read operation, and all transistors are turned off before the write operation and the read operation.

First, the first transistor Tr1b connected to the first elongated terminal T1b in a column where the magnetic recording unit 3b to be written exists is turned on, and the write assist voltage $V_{Assist}$ is applied to the heavy metal layer 2 on the lower side of the magnetic recording unit 3b through the insulating layer 5. Next, the third transistor Tr3 connected to the magnetic memory array 30a in a column where the magnetic recording unit 3b to be written exists is turned on to cause the write current Iw to flow from one end to the other end of the heavy metal layer 2 of the magnetic memory array 30a. According to this, a magnetization of the recording layer of the magnetic recording unit 3b to be written is reversed, and data is written. In this manner, in the magnetic memory device 50, data is written to a magnetic recording unit (magnetic recording unit 3b) existing at an intersection of a selected column (the first elongated terminal T1b) and a selected row (the magnetic memory array 30a).

In the magnetic memory device 50, data may be collectively written to a plurality of magnetic recording units by selecting a plurality of rows and a plurality of columns. In addition, data "0" or data "1" can be collectively written to a plurality of magnetic recording units by making the sign of the write assist voltage $V_{Assist}$ different for every column or by making a flowing direction of the write current Iw different for every row.

Next, a read method for the magnetic memory device 50 will be described. Here, description will be given of a case where data of the magnetic recording unit 3b of the magnetic memory array 30a is read out as an example. First, the third transistor Tr3 connected to the magnetic memory array 30a in a column where the magnetic recording unit 3b to be read exists is turned on. Next, the second transistor Tr2 connected to the magnetic recording unit 3 of the magnetic memory array 30a is turned on, and the read current Ir is caused to flow from the third terminal T3 to the second terminal through the heavy metal layer 2. In addition, data written to the magnetic recording unit 3b is read out from the read current Ir. In this manner, in the magnetic memory device 50, data is read out by selecting the magnetic recording unit (the magnetic recording unit 3b) to be read out by turning on the third transistor Tr3 in the magnetic memory array where the magnetic recording unit exists and by turning on the second transistor Tr2 connected to the magnetic recording unit.

Figure 12:
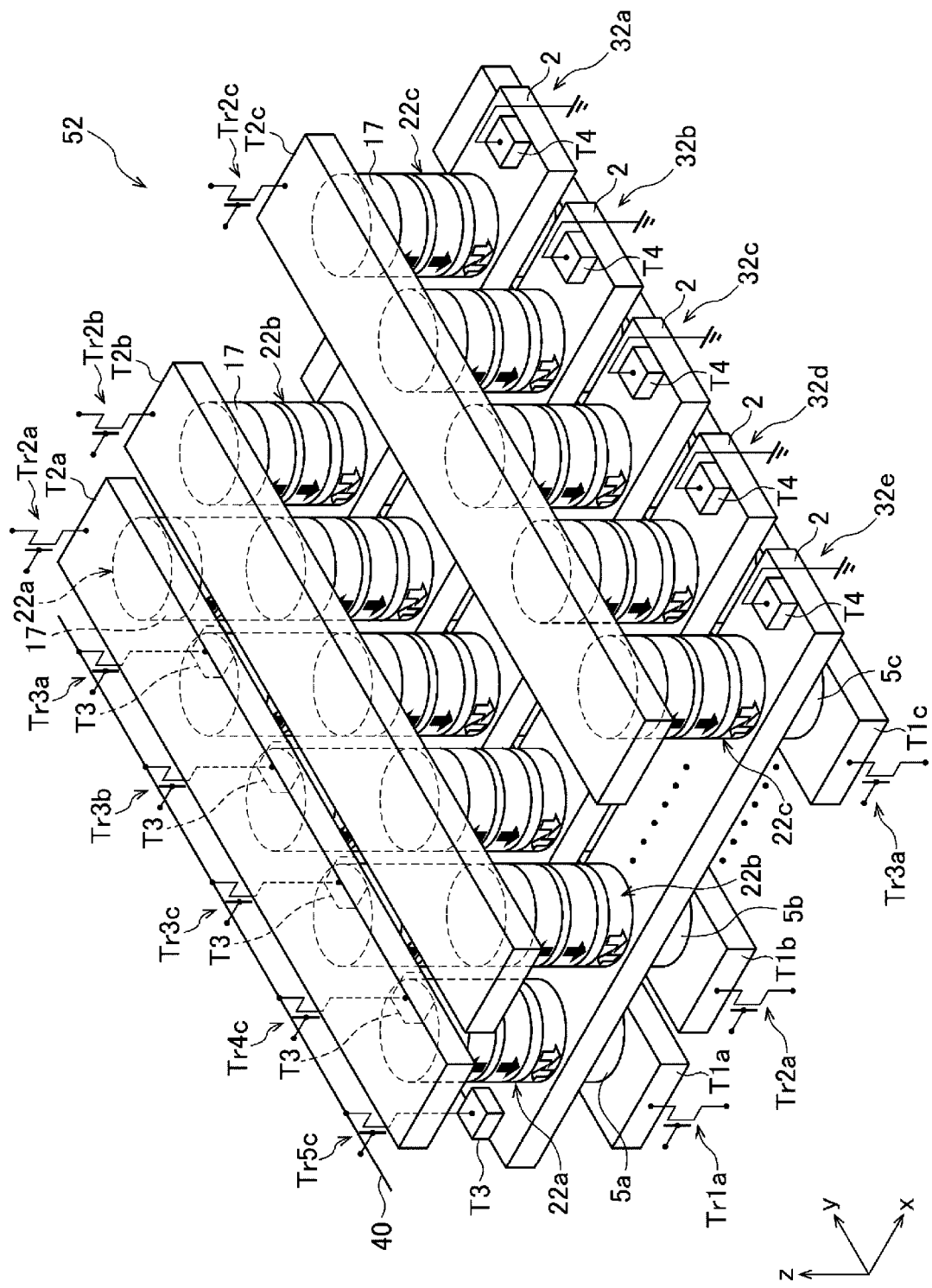
FIG. 12 is a perspective view illustrating a magnetic memory device of the embodiment of the invention.

When a plurality of the magnetic memory arrays 32 including the magnetic recording units 22a, 22b, and 22c provided with a diode 17 on the reference layer are arranged in a direction (y-direction) orthogonal to the first direction, as in a magnetic memory device 52 illustrated in FIG. 12 in which the same reference numeral is given to the same configuration as in FIG. 9B, the magnetic memory device capable of saving a space by grouping the second transistors Tr2 to one for every column is realized. Description will be given of the magnetic memory device 52 with focus given to a configuration different from the magnetic memory device 50. The magnetic memory device 52 is the same as the magnetic memory device 50 in an arrangement method of the magnetic memory arrays 32 and in a configuration of the first elongated terminals T1a, T1b, and T1c, and thus description thereof will be omitted.

In the magnetic memory device 52, second elongated terminals T2a, T2b, and T2c are formed in a film shape extending in the y-direction, and are provided at positions facing a plurality of arranged magnetic recording units 22a, 22b, or 22c one by one for every column of the magnetic recording units 22a, 22b, or 22c. The second elongated terminal T2a, T2b, or T2c is in contact with diodes 17 of the plurality of magnetic recording units 22a, 22b, or 22c which are arranged, and is shared by the magnetic recording units 22a, 22b, or 22c which are arranged in the same column. Drains of second transistors Tr2a, Tr2b, and Tr2c are respectively connected to the second elongated terminals T2a, T2b, and T2c at one end in the extending direction (y-direction), and the second transistors Tr2 which are respectively connected to the second terminals T2 are grouped into one for every column. Sources of the second transistors Tr2a, Tr2b, and Tr2c are connected to a control device (not illustrated), and a voltage level is set to the read voltage $V_{Read}$. Gates of the second transistors Tr2a, Tr2b, and Tr2c are connected to the control device, and are turned on or off by the control device.

In the magnetic memory device 52, each of the magnetic recording units 22a, 22b, and 22c includes the diode 17, and a current is suppressed from flowing from the second elongated terminals T2a, T2b, and T2c to the heavy metal layer 2. According to this, in the magnetic memory device 52, even when applying the read voltage $V_{Read}$ to the second elongated terminals T2a, T2b, and T2c in data reading, a current does not flow from the second elongated terminals T2a, T2b, and T2c to magnetic recording units (the magnetic recording units 22a and 22c) other than a magnetic recording unit (for example, the magnetic recording unit 22b) from which data is read out. Accordingly, it is not necessary to connect the second transistor Tr2 to the magnetic recording units 22a, 22b, and 22c, and it is not necessary to turn off a transistor of a magnetic recording unit to which a current is not desired to flow. Accordingly, the second transistor Tr2 may not be connected to the magnetic recording units 22a, 22b, and 22c. Accordingly, when the second transistors Tr2a, Tr2b, or Tr2c is provided in the second elongated terminal T2a, T2b, or T2c one by one, the number of transistors is reduced, and thus space saving can be realized.

A write method for the magnetic memory device 52 is the same as in the magnetic memory device 50, and thus description thereof will be omitted. Next, a read method for the magnetic memory device 52 will be described. Here, description will be given of a case where data of the magnetic recording unit 22b of the magnetic memory array 32a is read out as an example. First, the third transistor Tr3 connected to the magnetic memory array 32a in a column where the magnetic recording unit 22b to be read exists is turned on. Next, the second transistor Tr2b of the second elongated terminal T2b connected to the magnetic recording unit 22b of the magnetic memory array 32a is turned on, the read voltage $V_{Read}$ is applied to the second elongated terminal T2b, and the read current Ir is caused to flow from the third terminal T3 to the second terminal T2 through the heavy metal layer 2. In addition, data written to the magnetic recording unit 22b is read out from the read current Ir. In this manner, in the magnetic memory device 52, stored data is read out from a magnetic recording unit (the magnetic recording unit 22b) existing at an intersection of a selected column (the second elongated terminal T2b) and a selected row (the magnetic memory array 32a).

Accordingly, in the magnetic memory device 52, data is written to a magnetic recording unit (magnetic recording unit 22a) existing at an intersection of a selected column (for example, the first elongated terminal T1a) and a selected row (for example, the magnetic memory array 32a), and data is read out from a magnetic recording unit (the magnetic recording unit 22b) existing at an intersection of a selected column (for example, the second elongated terminal T2b) and a selected row (for example, the magnetic memory array 32a). A so-called cross point type memory device is realized.

In the magnetic memory device 52, since the magnetic recording units 22a, 22b, or 22c arranged in a direction orthogonal to the first direction share the first elongated terminal T1a, T1b, or T1c, and share the second elongated terminal T2a, T2b, or T2c, the number of the first transistors and the number of the second transistors can be reduced to one for every first elongated terminal T1a, T1b, or T1c, and for every second elongated terminal T2a, T2b, or T2c. Accordingly, a space can be further saved, and a magnetic memory device with a higher density can be configured.

Data can also be collectively written to a plurality of magnetic recording units by selecting a plurality of rows and a plurality of columns in the magnetic memory device 50 as in the magnetic memory device 52. In addition, data "0" or data "1" can be collectively written to a plurality of magnetic recording units by making the sign of the write assist voltage $V_{Assist}$ different for every column or by making a flowing direction of the write current Iw different for every row.

REFERENCE SIGNS LIST 1, 1a, 1b Magnetoresistance effect element
2 Heavy metal layer
10 Recording layer
11 Barrier layer
12 Reference layer
30, 31, 32, 33 Magnetic memory array
50, 52 Magnetic memory device
Iw Write current
Ir Read current

The invention claimed is:

1. A magnetoresistance effect element comprising:
a heavy metal layer;
a magnetic recording unit including a recording layer that includes a ferromagnetic layer that is magnetized in a vertical direction with respect to a film surface and is provided on a front surface of the heavy metal layer, a barrier layer that is provided on a surface of the recording layer which is opposite to the heavy metal layer and is formed from an insulator, and a reference layer which is provided on a surface of the barrier layer which is opposite to the recording layer, and a magnetization of the reference layer is fixed in the vertical direction with respect to a film surface;
an insulating layer that is provided on a surface of the heavy metal layer which is opposite to the magnetic recording unit;
a first terminal that is connected to the insulating layer at a position facing the recording layer with the heavy metal layer and the insulating layer interposed therebetween and applies a voltage to the heavy metal layer through the insulating layer;
a second terminal that is connected to the reference layer; and
a third terminal and a fourth terminal which are connected to the heavy metal layer, and cause a write current to flow to the heavy metal layer between the magnetic recording unit and the insulating layer.

2. The magnetoresistance effect element according to claim 1,
wherein when a voltage is applied from the first terminal to the heavy metal layer through the insulating layer, and the write current flows between the third terminal and the fourth terminal, a magnetization of the recording layer is reversed.

3. The magnetoresistance effect element according to claim 1,
wherein the insulating layer is provided at a position facing the magnetic recording unit with the heavy metal layer interposed therebetween.

4. The magnetoresistance effect element according to claim 1,
wherein the insulating layer is provided on the entirety of the surface of the heavy metal layer on a side opposite to the front surface.

5. The magnetoresistance effect element according to claim 1,
wherein the insulating layer is formed from an insulator with a high dielectric constant.

6. The magnetoresistance effect element according to claim 1,
wherein when the magnetization of the recording layer of the magnetic recording unit is reversed, a voltage applied to the second terminal is set to OFF, and when a read current flows between the heavy metal layer and the second terminal, a voltage applied to the first terminal is set to OFF.

7. The magnetoresistance effect element according to claim 1,
wherein a diode is provided between the reference layer and the second terminal.

8. The magnetoresistance effect element according to claim 7,
wherein the diode suppresses a current from flowing from the second terminal to the heavy metal layer.

9. A magnetic memory array comprising:
a plurality of the magnetoresistance effect elements according to claim 1,
wherein the heavy metal layer of one of the magnetoresistance effect elements extends in a first direction,
the extended heavy metal layer is shared by the other plurality of magnetoresistance effect elements, and
the magnetic recording units are arranged in the first direction on the front surface of the heavy metal layer.

10. The magnetic memory array according to claim 9,
wherein a plurality of the magnetic recording units are arranged between the third terminal and the fourth terminal.

11. A magnetic memory device comprising:
a plurality of the magnetic memory arrays according to claim 9 which is arranged in a direction orthogonal to the first direction.

12. The magnetic memory device according to claim 11, further comprising:
a plurality of first elongated terminals extending in a direction orthogonal to the first direction,
wherein the plurality of magnetic recording units are arranged in a direction orthogonal to the first direction, and
the first elongated terminals are provided at positions facing the plurality of arranged magnetic recording units with the heavy metal layer and the insulating layer interposed therebetween.

13. A magnetic memory device comprising:
a magnetic memory array including a plurality of the magnetoresistance effect elements according to claim 7, the heavy metal layer of one of the magnetoresistance effect elements extending in a first direction, the extended heavy metal layer being shared by the other plurality of magnetoresistance effect elements, the magnetic recording units being arranged in the first direction on the front surface of the heavy metal layer;
a plurality of first elongated terminals extending in a direction orthogonal to the first direction; and
a plurality of second elongated terminals extending in a direction orthogonal to the first direction,
wherein a plurality of the magnetic memory arrays are arranged in a direction orthogonal to the first direction,
a plurality of the magnetic recording units are arranged in a direction orthogonal to the first direction,
the first elongated terminals are provided at positions facing the plurality of arranged magnetic recording units with the heavy metal layer and the insulating layer interposed therebetween, and
the second elongated terminals are provided at positions facing the plurality of arranged magnetic recording units, and are in contact with the diode.

14. A write method for a magnetoresistance effect element including a heavy metal layer, a magnetic recording unit including a recording layer that includes a ferromagnetic layer that is magnetized in a vertical direction with respect to a film surface and is provided on a front surface of the heavy metal layer, a barrier layer that is provided on a surface of the recording layer which is opposite to the heavy metal layer and is formed from an insulator, and a reference layer which is provided on a surface of the barrier layer which is opposite to the recording layer, and a magnetization of the reference layer is fixed in the vertical direction with respect to a film surface, and an insulating layer that is provided on a surface of the heavy metal layer which is opposite to the magnetic recording unit, the method comprising:
a magnetization reversal process of applying a voltage to the heavy metal layer through the insulating layer, and causing a write current to flow between one end and the other end of the heavy metal layer to reverse a magnetization direction of the recording layer.

15. The write method for a magnetoresistance effect element according to claim 14,
wherein in the magnetization reversal process,
after applying the voltage to the heavy metal layer through the insulating layer, the write current is caused to flow between the one end and the other end of the heavy metal layer.

* * * * *